US011723163B1

(12) United States Patent
Cavallaro et al.

(10) Patent No.: US 11,723,163 B1
(45) Date of Patent: Aug. 8, 2023

(54) SLIDING ELECTRONIC DEVICES WITH TRANSLATING FLEXIBLE DISPLAYS HAVING RIGIDLY COUPLED FOLDABLE SUBSTRATES AND CORRESPONDING METHODS

(71) Applicant: Motorola Mobility LLC, Chicago, IL (US)

(72) Inventors: Alberto R. Cavallaro, Northbrook, IL (US); Daniel P. Groebe, Lake Zurich, IL (US); Steve C Emmert, McHenry, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 17/684,201

(22) Filed: Mar. 1, 2022

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01)

(58) Field of Classification Search
USPC ........................................................ 361/807
See application file for complete search history.

(56) References Cited

U.S. PATENT DOCUMENTS

| 11,071,218 | B2 | 7/2021 | Wittenberg | |
|---|---|---|---|---|
| 2020/0329572 | A1* | 10/2020 | Wittenberg | ........... G06F 1/1652 |
| 2021/0373603 | A1* | 12/2021 | Feng | ...................... G06F 1/1624 |
| 2021/0375165 | A1* | 12/2021 | Feng | ....................... G09F 9/301 |
| 2022/0046811 | A1* | 2/2022 | Kim | ...................... G06F 1/1624 |
| 2022/0240400 | A1* | 7/2022 | Zhou | ..................... G06F 1/1624 |

FOREIGN PATENT DOCUMENTS

WO 2019107909 6/2019

* cited by examiner

*Primary Examiner* — Hung S. Bui
(74) *Attorney, Agent, or Firm* — Philip H. Burrus, IV

(57) ABSTRACT

An electronic device includes a first device housing and a second device housing that is slidable relative to the first device housing. A flexible display is supported by a foldable substrate having a first end of the foldable substrate rigidly coupled to the first device housing. A second end of the foldable substrate is rigidly coupled to a tensioner.

20 Claims, 12 Drawing Sheets

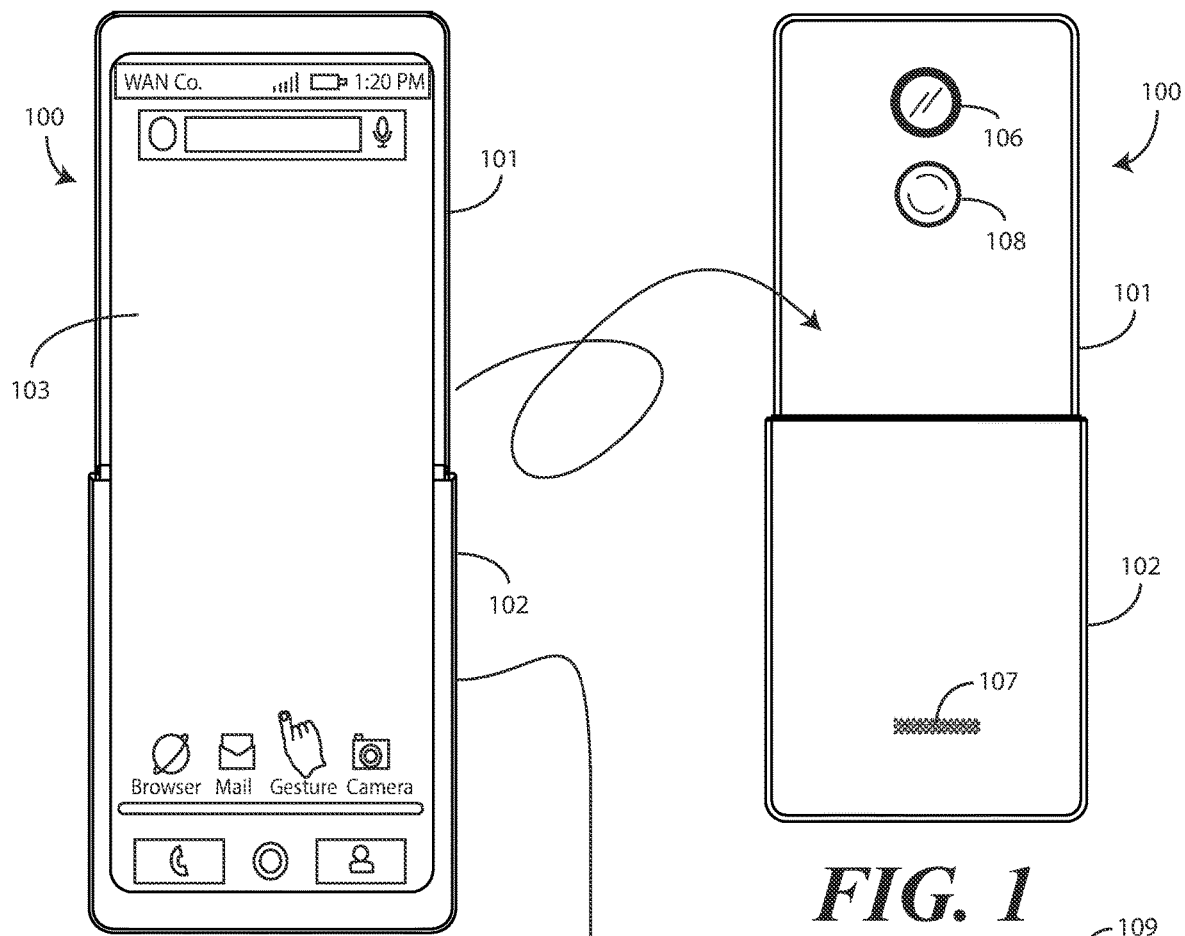
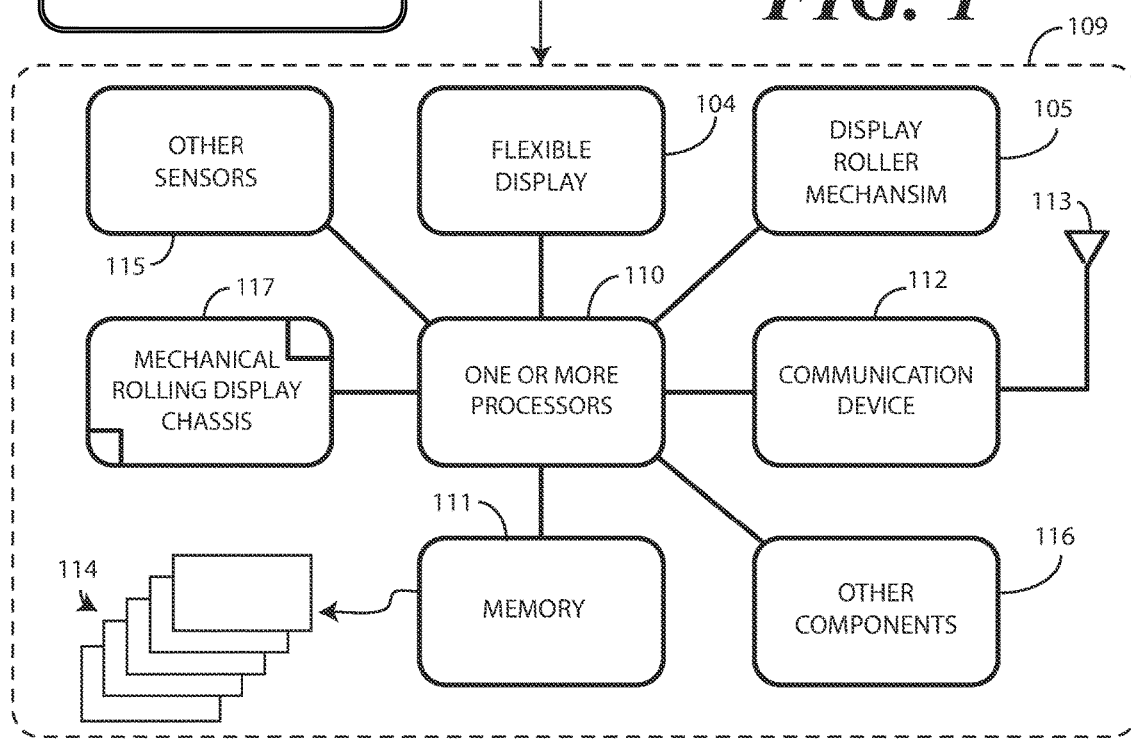
FIG. 1

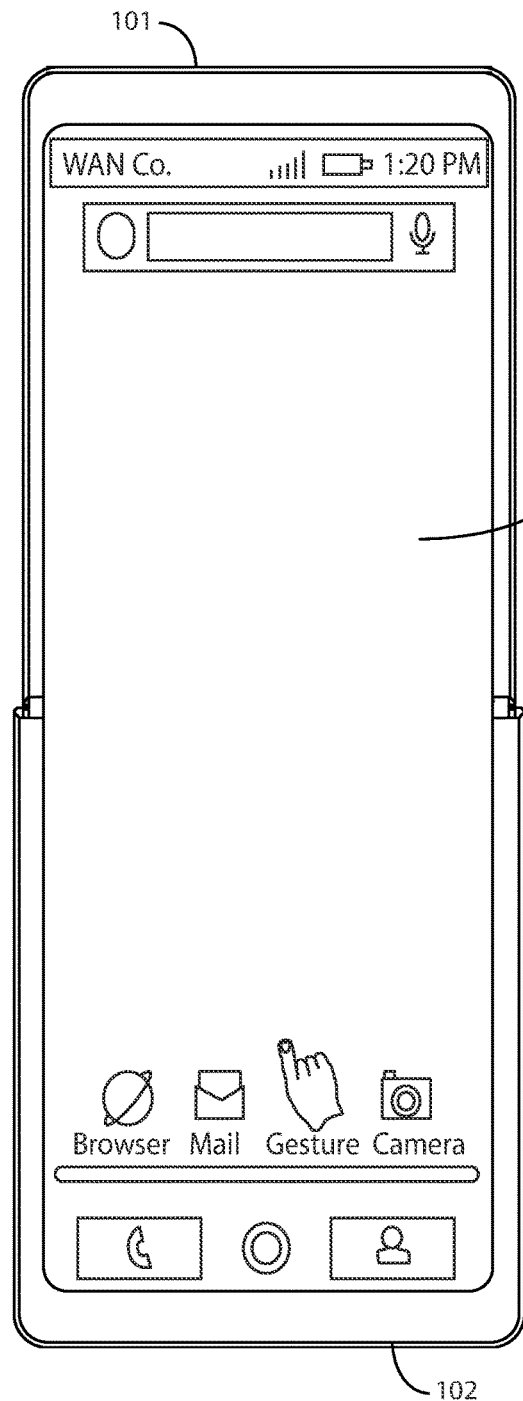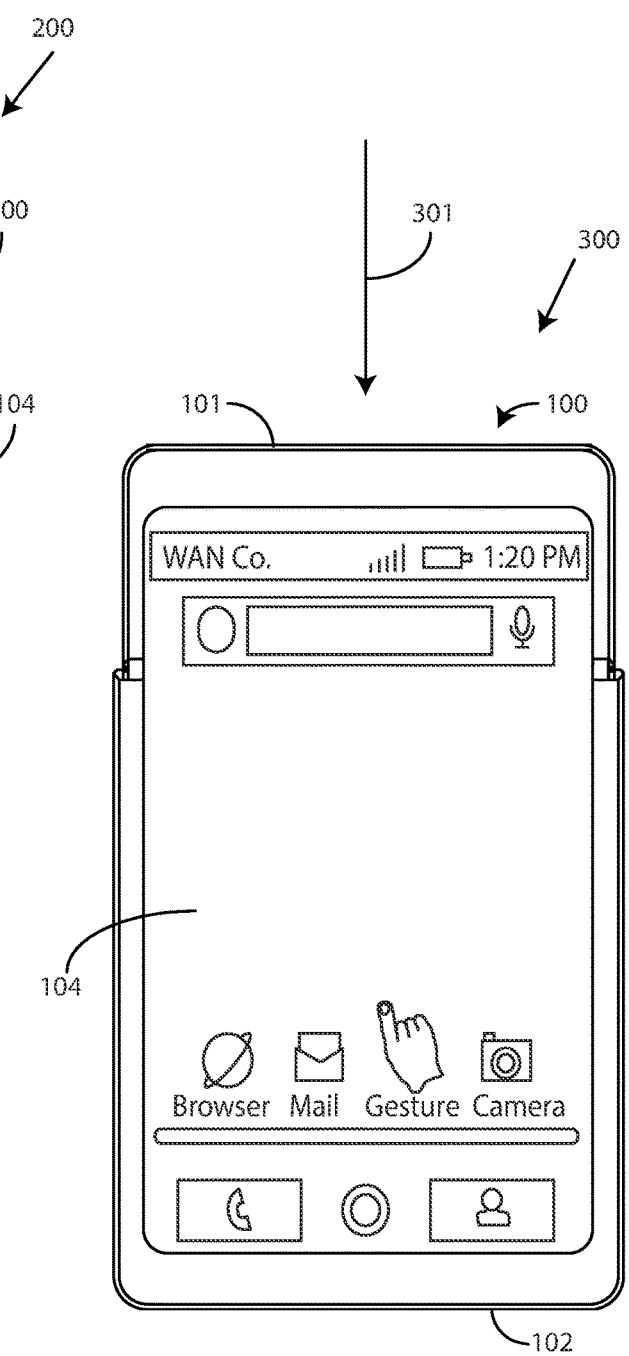
*FIG. 2*     *FIG. 3*

SLIDING ELECTRONIC DEVICES WITH TRANSLATING FLEXIBLE DISPLAYS HAVING RIGIDLY COUPLED FOLDABLE SUBSTRATES AND CORRESPONDING METHODS

BACKGROUND

Technical Field

This disclosure relates generally to electronic devices, and more particularly to electronic devices having housings that slide relative to each other.

Background Art

Portable electronic communication devices, especially smartphones, have become ubiquitous. People all over the world use such devices to stay connected. These devices have been designed in various mechanical configurations. A first configuration, known as a "candy bar," is generally rectangular in shape, has a rigid form factor, and has a display disposed along a major face of the electronic device. By contrast, a "clamshell" device has a mechanical hinge that allows one housing to pivot relative to the other. A third type of electronic device is a "slider" where one device housing slides relative to the other.

Some consumers prefer candy bar devices, while others prefer clamshell devices. Still others prefer sliders. The latter two types of devices are convenient in that they are smaller in a closed position than in an open position, thereby fitting more easily in a pocket. While clamshell devices are relatively straight forward mechanically, sliding devices are more complicated, both mechanically and electrically. This is especially true when a flexible display is used as the primary user interface. It would thus be desirable to have an improved electronic device that provides a slider construction operable with a flexible display.

BRIEF DESCRIPTION OF THE DRAWINGS

FIG. 1 illustrates one explanatory sliding electronic device in accordance with one or more embodiments of the disclosure.

FIG. 2 illustrates one explanatory sliding electronic device in an open position.

FIG. 3 illustrates one explanatory sliding electronic device in a closed position.

Figure 4:
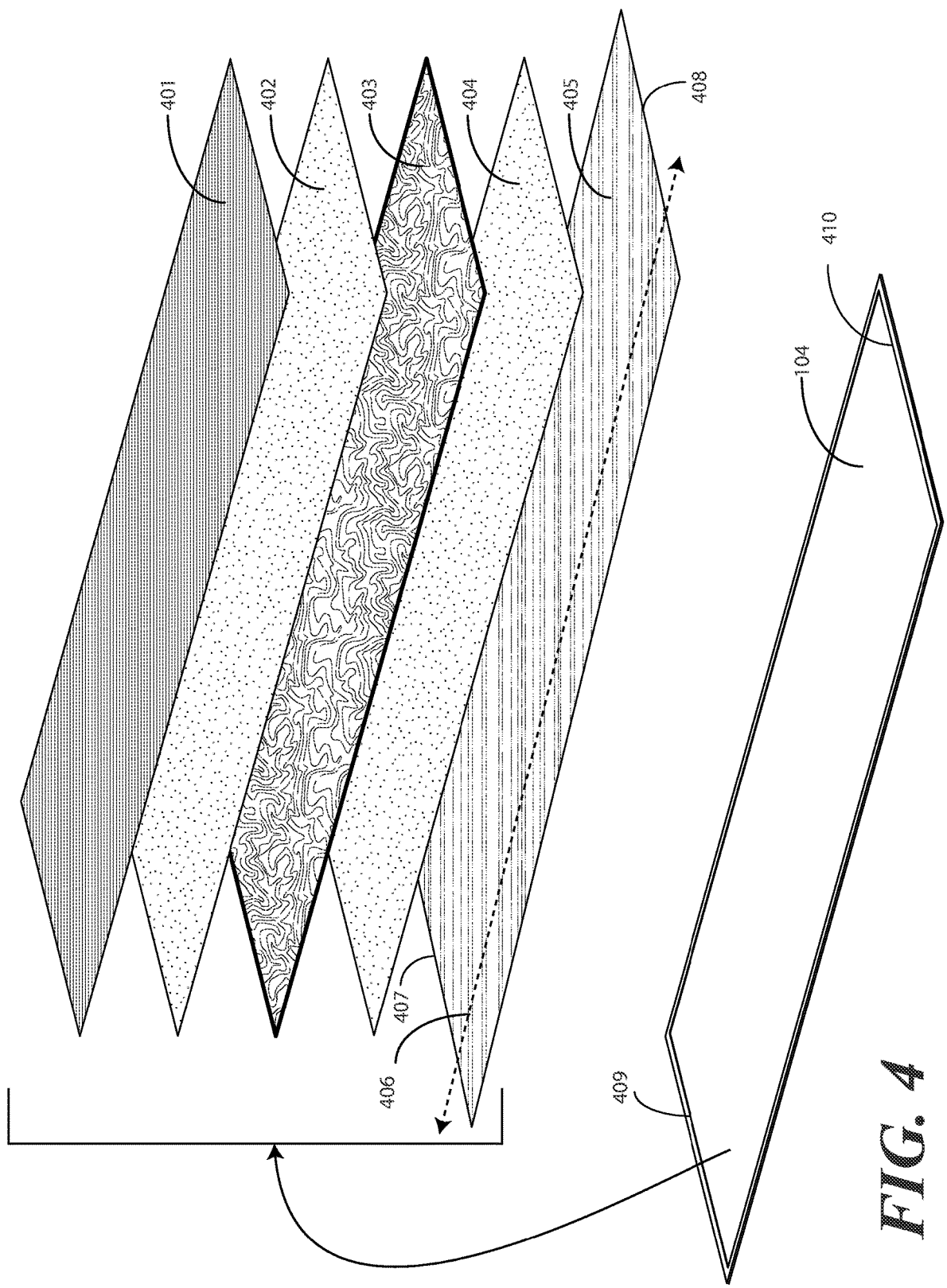
FIG. 4 illustrates an exploded view of one explanatory flexible display in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path.

The terms "substantially," "essentially," "approximately," "about," or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide an electronic device that includes at least a first device housing and a second device housing. In one or more embodiments, the first device housing is configured to slide relative to the second device housing. Illustrating by example, in one explanatory embodiment, the first device housing slides into and out of the second device housing to change an overall length of the sliding electronic device. In other embodiments, the second device housing can slide into and out of the first device housing to achieve the same result. Accordingly, in one or more embodiments a sliding electronic device includes a first device housing and a second device housing that slide relative to each other to transition between a closed position, an open position, and a plurality of partially open positions therebetween.

In one or more embodiments, a flexible display is coupled to the first device housing and the second device housing. The flexible display engages a rotor in one device housing. When the first device housing and second device housing slide relative to each other, the flexible display wraps around the rotor to extend further from, or back into, the device housing in which the rotor is situated.

In one or more embodiments, a cross section of the flexible display defines a J-shape with a curved portion of the J-shape wrapped around the rotor and an upper portion of the J-shape passing across a translation surface of the device. It should be understood that this J-shape is defined when the first device housing and second device housing are positioned at certain geometric relationships relative to each other. Depending upon the length of the flexible display, combined with the amount the first device housing can slide relative to the second device housing, the J-shape may transition to other shapes as well, including a U-shape where the upper and lower portions of the flexible display are substantially symmetrical, or an inverted J-shape where the upper portion of the flexible display is shorter than the lower portion of the flexible display, and so forth.

When the sliding electronic device opens, the upper portion of the J-shape becomes longer as the flexible display wraps around the rotor and extends further out of the device housing. When the sliding electronic device closes, the upper portion of the J-shape becomes shorter as the reverse operation occurs. Thus, when the first device housing translates relative to the second device housing, the flexible display deforms at different locations as it wraps and passes around the rotor.

In one or more embodiments, the rotor not only facilitates the perceived "extension" of the flexible display that occurs during an opening operation, but also works to improve the reliability and usability of the flexible display. This is true because the rotor defines a service loop about which the flexible display curves. The service loop prevents the flexible display from being damaged or developing memory in the folded position when the electronic device is in the closed position.

In one or more embodiments, the flexible display comprises an assembly that includes a foldable substrate, a foldable display, and a fascia layer, as well as one or more adhesive layers to couple these components together. Embodiments of the disclosure contemplate that some of these layers are stiffer than others, while other layers are softer than others. For example, in one or more embodiments the foldable substrate is manufactured from stainless steel, while the adhesive layer is an optically transparent adhesive measuring only about fifty microns in thickness. The stainless-steel layer is stiffer than the adhesive layer, while the adhesive layer is softer than the stainless-steel layer. Similarly, the foldable display may be softer than the stainless steel, yet stiffer than the adhesive layer, and so forth.

Embodiments of the disclosure contemplate that these differing stiffness layers can cause the flexible display to not bend with as tight a bending radius around the rotor as would be desirable under a given set of loading forces. Said differently, for a given set of loading forces applied to the flexible display by the rotor, the flexible display may not bend sufficiently around desired radiuses so as to be positioned where desired when the electronic device is in the open position, the closed position, or there between. Illustrating by example, when the electronic device is in any of these positions, the portion of the flexible display extending from the rotor may not extend tangentially from the top of the rotor. This causes a "pillowing" effect where a portion of the flexible display bulges from the electronic device. Alternatively, the flexible display may attempt to "bunch" when the electronic device is closed.

To eliminate these mechanical issues, and to provide for a more even movement of a flexible display around a rotor in a sliding electronic device, in one or more embodiments an electronic device is equipped with a mechanical assembly that includes a slider framework fixedly coupled to the first device housing of a sliding electronic device. In one or more embodiments, a display mover is slidably coupled to the slider framework, as is a housing mover.

In one or more embodiments, one end of the flexible display is fixedly coupled to the second device housing, while the other end of the flexible display is coupled to the display mover. The housing mover is then coupled to the second device housing.

In one or more embodiments, it is the foldable substrate of the flexible display that is used to couple the flexible display to the second device housing and/or the display mover. Illustrating by example, in one or more embodiments the foldable substrate is longer along its major axis than is the flexible display. Accordingly, a first end and a second end of the foldable substrate extends distally beyond the terminal ends of the flexible display. This allows the first end and the second end of the foldable substrate to be rigidly coupled to the display mover and second device housing.

In one or more embodiments, one or more fasteners are used to couple the first end and the second end of the foldable substrate to the display mover and second device housing. The use of such fasteners "rigidly" couples these ends of the foldable substrate to their corresponding components because the fasteners do not bend, slip, translate, or otherwise allow the ends of the foldable substrate to move. This is in contrast to adhesively coupling the ends of the foldable substrate to the display mover and second device housing where the adhesive can stretch, sheer, or expand to allow small amounts of movement of the first end and/or the second end of the foldable substrate as a function of temperature, age, or other factors. Thus, as used herein "rigidly coupled" means attached by a mechanical fastener that is not an adhesive and that does not expand, stretch, or sheer as a function of temperature or age. Examples of such fasteners include welds, screws, pins, clamps, or other mechanical mechanisms that can fixedly attach the first end and second end of the foldable substrate to the second device housing and display mover.

In one or more embodiments, an actuator is coupled between the display mover and the housing mover. In one or more embodiments, the actuator causes the display mover and the housing mover to slide symmetrically in opposite directions along the slider framework when the second device housing slides relative to the first device housing between a closed position and an open position.

Advantageously, embodiments of the disclosure provide an improved sliding mechanism for a flexible display in a sliding electronic device that eliminates crumpling and pillowing tendencies of the flexible display. Moreover, embodiments of the disclosure maintain this "pillowing prevention" by using fasteners or welds that rigidly couple the ends of the foldable substrate in place without allowing them to slide or translate once so fixed. Using such a mechanical assembly, combined with fasteners that attach ends of the foldable substrate to other mechanical components of the assembly, the flexible display maintains a flat upper portion of the J-shape when sliding. Additionally, the flexible display doesn't tend to crumple or bunch when sliding into the first device housing. Instead, the display mover ensures a straight and true translation of the flexible display into the first device housing when the first device housing and second device housing slide from the open position to the closed position.

Advantageously, embodiments of the disclosure preserve the operability and functionality of the flexible display during sliding operations. Embodiments of the disclosure additionally prevent the application of elevated mechanical strains and stresses to the various layers of the flexible display. When the sliding operation is cycled numerous times, these elevated mechanical strains and stresses can cause mechanical failure in one or more of the layers of the flexible display. Advantageously, embodiments of the disclosure prevent this from occurring.

In one or more embodiments, a tensioner can be rigidly coupled between the display mover and the end of the foldable substrate supporting the flexible display. The tensioner can comprise one or more springs that apply a loading force biasing an end of the foldable substrate supporting the flexible display toward an end of the first device housing. Said differently, in one or more embodiments the tensioner can comprise one or more springs biasing an end of the foldable substrate supporting the flexible display away from the rotor. The inclusion of a tensioner advantageously allows for increased mechanical tolerances when designing the electronic device. The tensioner also helps to avoid the pillowing effect by applying a loading force that eliminates slack from the flat portions of the flexible display defining the partial J-shape.

In one or more embodiments, one or more load path directing apertures can be introduced into the foldable substrate supporting the flexible display. The one or more load path directing apertures work to direct loading forces applied by the tensioner in a direction that is substantially parallel with a major axis of the foldable substrate and, therefore, the flexible display. Illustrating by example, the one or more load path directing apertures can include columns of substantially rectangular apertures defining linear load paths therebetween that ensure that load forces are oriented parallel with the major axis of the stiffest layer, i.e., the foldable substrate, as those loading forces extend between the first end of the foldable substrate to the second end of the foldable substrate.

In one or more embodiments, an electronic device comprises a first device housing slidably coupled to a second device housing. The electronic device also includes a flexible display having a first end and a second end. The flexible display is supported by a foldable substrate, which is stiffer than any of the other layers of the flexible display assembly in one or more embodiments.

In one or more embodiments, the electronic device includes a reverse motion link causing a display mover coupled to the second end of the flexible display and a housing mover coupled to the second device housing to travel symmetrically in opposite directions. As noted above, the electronic device can include a tensioner rigidly coupled between the second end of the flexible display and the display mover that applies a loading force removing slack from the flexible display. The tensioner advantageously causes the flexible display itself to remain flat.

In one or more embodiments, the first device housing that is configured to slide relative to a second device housing between a closed position and an open position. The flexible display is coupled to the second device housing and the display mover (or the tensioner coupled between the flexible display and the display mover) such that the flexible display translates along a translation surface defined by one or both of the first device housing and the second device housing.

Turning now to FIG. 1, illustrated therein is one explanatory electronic device 100 configured in accordance with one or more embodiments of the disclosure. The electronic device 100 of FIG. 1 is a portable electronic device. For illustrative purposes, the electronic device 100 is shown as a smartphone. However, the electronic device 100 could be any number of other devices as well, including tablet computers, gaming devices, multimedia players, and so forth. Still other types of electronic devices can be configured in accordance with one or more embodiments of the disclosure as will be readily appreciated by those of ordinary skill in the art having the benefit of this disclosure.

The electronic device 100 includes a first device housing 101 and a second device housing 102. In one or more embodiments, the first device housing 101 slides relative to the second device housing 102. In the illustrative embodiment of FIG. 1, the first device housing 101 can selectively slide into, and out of, the second device housing 102. However, in other embodiments the opposite will be true, with the second device housing 102 being selectively slidable into and out of the first device housing 101.

In one or more embodiments, one of the first device housing 101 or second device housing 102 includes rails that couple to tracks in the other of the first device housing 101 or the second device housing 102. For instance, the first device housing 101 can have rails that couple to tracks in the second device housing 102. In another embodiment, the first device housing 101 may have a rail and a track, with the second device housing 102 having a complementary rail and track that engage the rail and track of the first device housing 101 to facilitate the sliding operation. Other techniques that allow the first device housing 101 and the second device housing 102 to slide relative to each other between a closed position (shown below in FIG. 3) and the open position of FIG. 1 will be obvious to those of ordinary skill in the art having the benefit of this disclosure.

In one or more embodiments the first device housing 101 and the second device housing 102 are manufactured from a rigid material such as a rigid thermoplastic, metal, or composite material, although other materials can be used. Illustrating by example, in one illustrative embodiment the first device housing 101 and the second device housing 102 are manufactured from aluminum. Still other constructs will be obvious to those of ordinary skill in the art having the benefit of this disclosure.

In the illustrative embodiment of FIG. 1, the electronic device 100 includes a single sliding mechanism where the first device housing 101 slides relative to the second device housing 102. However, in other embodiments two or more sliding mechanisms can be incorporated into the electronic device 100 to allow it to be slide at multiple locations, such as in a telescoping configuration.

This illustrative electronic device 100 of FIG. 1 includes a display 103. The display 103 can optionally be touch-sensitive. Users can deliver user input to the display 103 of such an embodiment by delivering touch input from a finger, stylus, or other objects disposed proximately with the display 103.

In one embodiment, the display 103 is configured as an organic light emitting diode (OLED) display fabricated on a flexible plastic substrate, thereby making the display 103 a flexible display 104. This allows the display 103 to be flexible so as to deform around a display roller mechanism 105, one example of which is a rotor that will be shown and described below with reference to FIG. 5, when the first device housing 101 slides relative to the second device housing 102. When a flexible display 104 is used, in one or more embodiments an OLED is constructed on flexible plastic substrates can allow the flexible display 104 to bend with various bending radii around the display roller mechanism 105.

In one or more embodiments the flexible display 104 may be formed from multiple layers of flexible material such as flexible sheets of polymer or other materials. In this illustrative embodiment, the flexible display 104 is fixedly coupled to the first device housing 101 and extends into the second device housing 102 and around the display roller mechanism 105. The flexible display 104 spans the engagement line at which the first device housing 101 slides into, and out of, the second device housing 102 in this illustrative embodiment.

Features can be incorporated into the first device housing 101 and/or the second device housing 102. Examples of such features include a camera 106 or an optional speaker port 107, which are shown disposed on the rear side of the electronic device 100 in this embodiment but could be placed on the front side as well. In this illustrative embodiment, a user interface component 108, which may be a button, fingerprint sensor, or touch sensitive surface, can also be disposed along the rear side of the first device housing 101. As noted, any of these features are shown being disposed on the rear side of the electronic device 100 in this embodiment, but could be located elsewhere, such as on the front side in other embodiments. In other embodiments, these features may be omitted.

The electronic device 100 can optionally include at least a second display. Illustrating by example, in one embodiment the camera 106 and the user interface component 108 can be moved to the second device housing 102, with a second display being positioned where the camera 106 and user interface component 108 are positioned in FIG. 1. The second display could be coupled to the second device housing 102 as well. In still other embodiments, a second display can be coupled to the first device housing 101, while a third display (not shown) is coupled to the second device housing 102. Thus, electronic devices configured in accordance with embodiments of the disclosure can include displays situated at different positions.

A block diagram schematic 109 of the electronic device 100 is also shown in FIG. 1. The block diagram schematic 109 includes one or more electronic components that can be coupled to a printed circuit board assembly disposed within either or both of the first device housing 101 or the second device housing 102 of the electronic device 100. The components of the block diagram schematic 109 can be electrically coupled together by conductors or a bus disposed along one or more printed circuit boards. For example, some components of the block diagram schematic 109 can be configured as a first electronic circuit fixedly situated within the first device housing 101, while other components of the block diagram schematic 109 can be configured as a second electronic circuit fixedly situated within the second device housing 102. A foldable substrate can then extend from the first electronic circuit in the first device housing 101 to the second electronic circuit in the second device housing 102 to electrically couple the first electronic circuit to the second electronic circuit.

In one or more embodiments, the electronic device 100 includes one or more processors 110. In one embodiment, the one or more processors 110 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 111, can optionally store the executable software code used by the one or more processors 110 during operation.

In this illustrative embodiment, the electronic device 100 also includes a communication circuit 112 that can be configured for wired or wireless communication with one or more other devices or networks. The networks can include a wide area network, a local area network, and/or personal area network. The communication circuit 112 may also utilize wireless technology for communication, such as, but are not limited to, peer-to-peer or ad hoc communications such as HomeRF, Bluetooth and IEEE 802.11, and other forms of wireless communication such as infrared technology. The communication circuit 112 can include wireless communication circuitry, one of a receiver, a transmitter, or transceiver, and one or more antennas 113.

In one embodiment, the one or more processors 110 can be responsible for performing the primary functions of the electronic device 100. For example, in one embodiment the one or more processors 110 comprise one or more circuits operable with one or more user interface devices, which can include the display 103, to present, images, video, or other presentation information to a user. The executable software code used by the one or more processors 110 can be configured as one or more modules 114 that are operable with the one or more processors 110. Such modules 114 can store instructions, control algorithms, logic steps, and so forth.

In one embodiment, the one or more processors 110 are responsible for running the operating system environment of the electronic device 100. The operating system environment can include a kernel and one or more drivers, and an application service layer, and an application layer. The operating system environment can be configured as executable code operating on one or more processors or control circuits of the electronic device 100. The application layer can be responsible for executing application service modules. The application service modules may support one or more applications or "apps." The applications of the application layer can be configured as clients of the application service layer to communicate with services through application program interfaces (APIs), messages, events, or other inter-process communication interfaces. Where auxiliary processors are used, they can be used to execute input/output functions, actuate user feedback devices, and so forth.

In one embodiment, the one or more processors 110 may generate commands or execute control operations based on information received from the sensors 115 of the electronic device 100. The one or more processors 110 may also generate commands or execute control operations based upon information received from a combination of the one or more sensors 115, the flexible display 104, and/or the other input devices such as the user interface component 108. Alternatively, the one or more processors 110 can generate commands or execute control operations based upon information received from the one or more sensors 115 or the flexible display 104 alone. Moreover, the one or more processors 110 may process the received information alone or in combination with other data, such as the information stored in the memory 111.

The one or more sensors 115 may include a microphone, an earpiece speaker, a second loudspeaker (disposed beneath speaker port 107), and a user interface component 108 such as a button or touch-sensitive surface. The one or more other sensors 115 may also include key selection sensors, proximity sensors, a touch pad sensor, a touch screen sensor, a capacitive touch sensor, and one or more switches. Touch sensors may used to indicate whether any of the user actuation targets present on the display 103 are being actuated. Alternatively, touch sensors disposed in the electronic device 100 can be used to determine whether the electronic device 100 is being touched at side edges or major faces of the first device housing 101 or the second device housing 102. The touch sensors can include surface and/or housing capacitive sensors in one embodiment. The other sensors 115 can also include audio sensors and video sensors (such as the camera 106).

The other sensors 115 can also include motion detectors, such as one or more accelerometers or gyroscopes. For example, an accelerometer may be embedded in the electronic circuitry of the electronic device 100 to show vertical orientation, constant tilt and/or whether the electronic device 100 is stationary. A gyroscope can be used in a similar fashion.

Other components 116 operable with the one or more processors 110 can include output components such as video outputs, audio outputs, and/or mechanical outputs. Examples of output components include audio outputs such as speaker port 107, earpiece speaker, or other alarms and/or buzzers and/or a mechanical output component such as vibrating or motion-based mechanisms. Still other components will be obvious to those of ordinary skill in the art having the benefit of this disclosure.

In one or more embodiments, a mechanical assembly 117 is operable within the electronic device 100. In one or more embodiments, the mechanical assembly 117 includes a slider framework that is fixedly coupled to the second device housing 102. As used herein, the term "framework" takes the ordinary English definition of a mechanical support structure supporting the other components coupled to the slider framework. These components include a display mover slidably coupling the flexible display 104 to the slider framework and a housing mover slidably coupling the first device housing 101 to the slider framework.

In one or more embodiments, the mechanical assembly 117 comprises an actuator coupled between the display mover and the housing mover. The actuator causes the display mover and the housing mover to slide symmetrically in opposite directions along the slider framework when the first device housing 101 slides relative to the second device housing 102 between the open position of FIG. 1 and the closed position of FIG. 3. The mechanical assembly 117 can include a flexible display support structure positioned between portions of the flexible display 104 and a translation surface defined by the second device housing 102.

It is to be understood that FIG. 1 is provided for illustrative purposes only and for illustrating components of one electronic device 100 in accordance with embodiments of the disclosure and is not intended to be a complete schematic diagram of the various components required for an electronic device. Therefore, other electronic devices in accordance with embodiments of the disclosure may include various other components not shown in FIG. 1 or may include a combination of two or more components or a division of a particular component into two or more separate components, and still be within the scope of the present disclosure.

Turning now to FIG. 2, illustrated therein is the electronic device 100 in an open position 200. In the axially displaced open position 200, the first device housing 101 slides out of the second device housing 102, thereby revealing the flexible display 104. In such a configuration, front surfaces of the first device housing 101 and the second device housing 102 effectively define a plane. Since this illustrative embodiment includes a flexible display 104, the flexible display 104 has been elongated into a flat position.

Turning now to FIG. 3, illustrated therein is the electronic device 100 in a closed state. In this state, the first device housing 101 slides 301 into the second device housing 102 toward the second device housing 102 to a closed position 300. This causes the overall length of the electronic device 100 to get shorter. Additionally, the flexible display 104 inserts into the second device housing 102 by passing around the display roller mechanism (105) and becoming concealed within the second device housing 102. When the electronic device 100 opens again, the concealed portions of the flexible display 104 are again revealed.

In some embodiments, features can be included to further retain the electronic device 100 in the closed position 300. Illustrating by example, in another embodiment, a mechanical latch can be included to retain the first device housing 101 and the second device housing 102 in the closed position 300. In still another embodiment, magnets can be incorporated into the first device housing 101 and the second device housing 102. For instance, magnets can be placed in the first device housing 101 and the second device housing 102 to retain the first device housing 101 and the second device housing 102 in the closed position 300.

In still other embodiments, frictional elements can be incorporated into the mechanical interface existing between the first device housing 101 and the second device housing 102 to retain the first device housing 101 and the second device housing 102 in a particular position. A stator motor could be integrated into electronic device 100 to drive the first device housing 101 and second device housing 102 together and apart as well.

In one or more embodiments the mechanical assembly (117) described above with reference to FIG. 1 can be used to retain the first device housing 101 and second device housing 102 in the closed position 300. Still other mechanical structures and devices suitable for retaining the electronic device 100 in the closed position 300 will be obvious to those of ordinary skill in the art having the benefit of this disclosure.

Turning now to FIG. 4, illustrated therein is one example of a flexible display 104 configured in accordance with one or more embodiments of the disclosure. As shown in FIG. 4, in one or more embodiments the flexible display 104 comprises one or more layers that are coupled or laminated together to complete the flexible display 104. In one or more embodiments, these layers comprise a flexible protective cover 401, a first adhesive layer 402, a flexible display layer 403, a second adhesive layer 404, and a foldable substrate 405. Other configurations of layers suitable for manufacturing the flexible display 104 will be obvious to those of ordinary skill in the art having the benefit of this disclosure.

Beginning from the top of the layer stack, in one or more embodiments the flexible protective cover 401 comprises an optically transparent substrate. In one or more embodiments the flexible protective cover 401 may be manufactured from an optically transparent material such a thin film sheet of a thermoplastic material. Illustrating by example, in one embodiment the flexible protective cover 401 is manufactured from a layer of optically transparent polyamide having a thickness of about eighty microns. In another embodiment, the flexible protective cover 401 is manufactured from a layer of optically transparent polycarbonate having a thickness of about eighty microns. Other materials suitable for manufacturing the flexible protective cover 401 will be obvious to those of ordinary skill in the art having the benefit of this disclosure.

In one or more embodiments the flexible protective cover 401 functions as a fascia by defining a cover for the flexible display layer 403. In one or more embodiments the flexible protective cover 401 is optically transparent, in that light can pass through the flexible protective cover 401 so that objects behind the flexible protective cover 401 can be distinctly seen. The flexible protective cover 401 may optionally include an ultra-violet barrier. Such a barrier can be useful in improving the visibility of flexible display layer 403 in one or more embodiments.

Beneath the flexible protective cover 401 is a first adhesive layer 402. In one or more embodiments, the first adhesive layer 402 comprises an optically transparent adhesive. The optically transparent adhesive can be applied to two sides of a thin, optically transparent substrate such that the first adhesive layer 402 functions as an optically transparent layer having optically transparent adhesive on both sides. Where so configured, in one or more embodiments the first adhesive layer 402 has a thickness of about fifty microns. This optically transparent version of "double-sided tape" can then be spooled and applied between the flexible protective cover 401 and the flexible display layer 403 to couple the two together.

In other embodiments the first adhesive layer 402 will instead be applied between the flexible protective cover 401 and the flexible display layer 403 as an optically transparent liquid, gel, as a homogeneous adhesive layer, or in the form of another medium. Where so configured, the first adhesive layer 402 can optionally be cured by heat, ultraviolet light, or other techniques. Other examples of materials suitable for use as the first adhesive layer 402 will be obvious to those of ordinary skill in the art having the benefit of this disclosure. In one or more embodiments, the first adhesive layer 402 mechanically couples the flexible display layer 403 to the flexible protective cover 401.

In one or more embodiments, the flexible display layer 403 is situated between the foldable substrate 405 and the flexible protective cover 401. In other embodiments, a layer above the flexible display layer 403 can be configured with enough stiffness to make the foldable substrate 405 unnecessary. For example, in an embodiment where the flexible protective cover 401 is configured with enough stiffness to retain the flexible display 104 in the proper shape, the foldable substrate 405 may be omitted.

The flexible display layer 403 can optionally be touch-sensitive. In one or more embodiments, the flexible display layer 403 is configured as an organic light emitting diode (OLED) display layer coupled to the foldable substrate 405, which allows the flexible display layer 403 to bend in accordance with various bending radii. For example, some embodiments allow bending radii of between thirty and six hundred millimeters. Other substrates allow bending radii of around five millimeters to provide a display that is foldable through active bending. Other displays can be configured to accommodate both bends and folds.

In one or more embodiments the flexible display layer 403 may be formed from multiple layers of flexible material such as flexible sheets of polymer or other materials. Illustrating by example, the flexible display layer 403 can include a layer of optically pellucid electrical conductors, a polarizer layer, one or more optically transparent substrates, and layers of electronic control circuitry such as thin film transistors to actuate pixels and one or more capacitors for energy storage. In one or more embodiments, the flexible display layer 403 has a thickness of about 130 microns.

In one or more embodiments, to be touch sensitive the flexible display layer 403 includes a layer including one or more optically transparent electrodes. In one or more embodiments, the flexible display layer 403 includes an organic light emitting diode layer configured to images and other information to a user. The organic light emitting diode layer can include one or more pixel structures arranged in an array, with each pixel structure comprising a plurality of electroluminescent elements such as organic light emitting diodes. These various layers can be coupled to one or more optically transparent substrates of the flexible display layer 403. Other layers suitable for inclusion with the flexible display layer 403 will be obvious to those of ordinary skill in the art having the benefit of this disclosure.

In one or more embodiments, the flexible display layer 403 is coupled to the foldable substrate 405 by a second adhesive layer 404. In one or more embodiments, to simplify manufacture, the second adhesive layer 404 is identical to the first adhesive layer 402 and comprises an optically transparent adhesive. However, since the second adhesive layer 404 is coupled between the flexible display layer 403 and the foldable substrate 405, i.e., under the flexible display layer 403, an optically transparent adhesive is not a requirement. The second adhesive layer 404 could be partially optically transparent or not optically transparent at all in other embodiments.

Regardless of whether the second adhesive layer 404 is optically transparent, in one or more embodiments the adhesive of the second adhesive layer 404 is applied to two sides of a thin, foldable substrate. Where so configured, in one or more embodiments the second adhesive layer 404 has a thickness of about fifty microns. This extremely thin version of "double-sided tape" can then be spooled and applied between the flexible display layer 403 and the foldable substrate 405 to couple the two together.

In other embodiments, as with the first adhesive layer 402, the second adhesive layer 404 will instead be applied between the flexible display layer 403 and the foldable substrate as a liquid, gel, as a homogeneous layer, or in the form of another medium. Where so configured, the second adhesive layer 404 can optionally be cured by heat, ultraviolet light, or other techniques. Other examples of materials suitable for use as the second adhesive layer 404 will be obvious to those of ordinary skill in the art having the benefit of this disclosure.

In one or more embodiments, the flexible display 104 comprises, and is supported by, a foldable substrate 405. In one or more embodiments the foldable substrate is coupled to the flexible display layer 403 and defines a mechanical support for the flexible display layer 403 due to the fact that the foldable substrate 405 is the stiffest layer of the flexible display 104. In one or more embodiments the foldable substrate 405 is manufactured from stainless steel with a thickness of about forty microns. In another embodiment, the foldable substrate 405 is manufactured from a flexible plastic. Other materials from which the foldable substrate 405 can be manufactured will be obvious to those of ordinary skill in the art having the benefit of this disclosure.

In one or more embodiments, the foldable substrate 405 is longer along a major axis 406 of the foldable substrate 405, and thus the flexible display 104 itself, than is the flexible display 104. For instance, as shown in FIG. 4 the foldable substrate 405 includes a first end 407 and a second end 408 that extend distally beyond terminal ends 409,410 of the flexible display 104. As will be described in more detail below, this extra length along the major axis 406 provided by the foldable substrate 405 allows one or more fasteners to rigidly couple the first end 407 and the second end 408 of the foldable substrate 405 to other components of the mechanical assembly.

Embodiments of the disclosure contemplate that some of the layers comprising the flexible display 104 are stiffer than others. Similarly, other layers of the flexible display 104 are softer than others. For example, where the foldable substrate 405 is manufactured from a metal, one example of which is stainless steel, this layer is stiffer than either the first adhesive layer 402 or the second adhesive layer 404. In one or more embodiments, the stainless steel is stiffer than the flexible display layer 403 as well. In one or more embodiments, the foldable substrate 405 is the stiffest layer in the flexible display 104 while the first adhesive layer 402 and the second adhesive layer 404 are the softest layers of the flexible display 104. The flexible protective cover 401 and the flexible display layer 403 have a stiffness that falls between that of the foldable substrate 405 and the adhesive layers in one or more embodiments.

In one or more embodiments, the various layers of the flexible display 104 are laminated together in a substantially planar configuration. Said differently, in one or more embodiments the foldable substrate 405 is configured as a substantially planar substrate. The second adhesive layer 404 can be attached to this substantially planar substrate, with the flexible display layer 403 then attached to the second adhesive layer 404. The first adhesive layer 402 can be attached to the flexible display layer 403, with the flexible protective cover 401 attached to the first adhesive layer 402.

To ensure proper coupling, the resulting flexible display layer 403 can be cured, such as in an autoclave at a predefined temperature for a predefined duration. Where employed, such curing allows any air bubbles or other imperfections in the various layers to be corrected. In one or more embodiments, since the foldable substrate 405 is configured as a substantially planar substrate, the resulting flexible display 104 is substantially planar as well.

Figure 5:
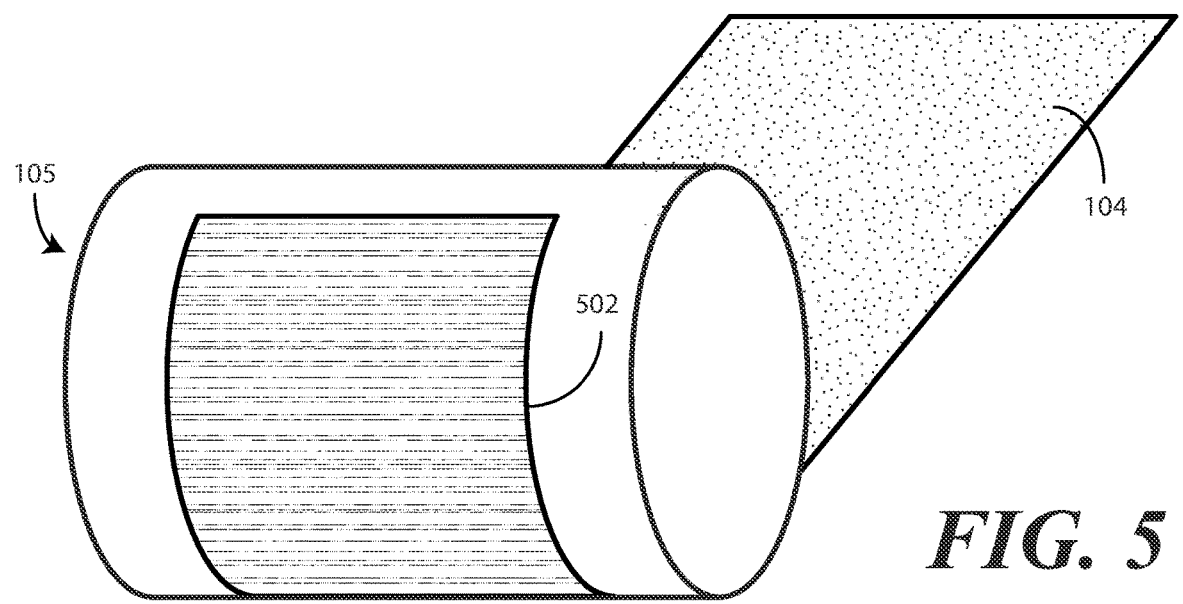
FIG. 5 illustrates one explanatory flexible display and rotor assembly configured in accordance with one or more embodiments of the disclosure.

Turning now to FIG. 5, illustrated therein is one explanatory display assembly configured for a sliding electronic device in accordance with one or more embodiments of the disclosure. In the illustrative embodiment of FIG. 5, the flexible display 104 wraps around a display roller mechanism 105. In this illustrative embodiment, the display roller mechanism 105 includes a rotor 501 that is positioned within a curvilinear section 502 of the flexible display 104. When placed within a device housing of a sliding electronic device, rotation of the rotor 501 causes a linear translation of the flexible display 104 across a translation surface or mechanical support by drawing the flexible display 104 around the rotor 501.

Figure 6:
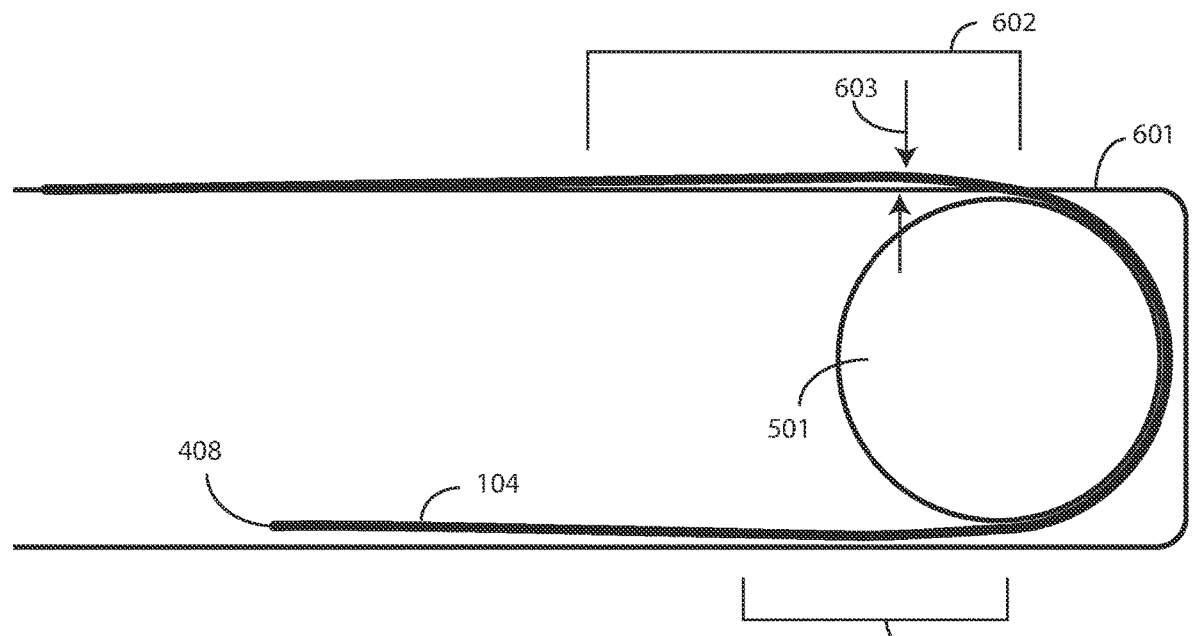
FIG. 6 illustrates one explanatory flexible display and rotor assembly situated within a device housing in accordance with one or more embodiments of the disclosure.

Turning now to FIG. 6, illustrated therein is a device housing 601 of a sliding electronic device with the rotor 501 and the flexible display 104 positioned therein. As described above with reference to FIG. 4, the flexible display 104 can include layers of differing stiffnesses. These differing stiffness layers can cause the flexible display 104 to not bend with as tight a bending radius as would be desirable under a given set of loading forces. Said differently, for a given set of loading forces applied to the flexible display 104, the flexible display 104 may not bend sufficiently around desired radiuses so as to be positioned where desired when the electronic device is in the open position, the closed position, or there between.

Illustrating by example, when the electronic device is in any of these positions, a portion 602 of the flexible display 104 extending distally from the rotor 501 may not extend tangentially from the top of the rotor 501. This causes a "pillowing" effect 603 where that portion 602 of the flexible display 104 bulges from the device housing 601 of electronic device. While the pillowing effect 603 is shown illustratively on the top of the rotor 501 in FIG. 6 for illustration, it should be noted that the pillowing effect 603 can occur below the rotor 501 as well. Similarly, when the rotor 501 rotates clockwise in the view of FIG. 6, a second portion 604 of the flexible display 104 can tend to crumple, bunch, snag, or otherwise not efficiently slide into the lower portion of the device housing 601 when the electronic device moves to the closed position.

To eliminate these issues, embodiments of the disclosure provide a reverse motion link comprising a display mover coupled to the second end 408 of the foldable substrate (405) supporting of the flexible display 104, a housing mover coupled to the other sliding device housing (not shown in FIG. 6), and an actuator. In one or more embodiments, the actuator causes the second portion 604 of the flexible display and the second device housing to travel symmetrically in opposite directions relative to the sliding device housing 601 when the electronic device moves from the closed position to the open position or, alternatively, from the open position to the closed position.

In one or more embodiments, a tensioner is then coupled between the display mover and the second portion 604 of the flexible display 104. Specifically, the second end 408 of the foldable substrate (405) supporting the flexible display 104 is fixedly and rigidly coupled to the tensioner, while the tensioner is fixedly coupled to the display mover. Illustrating by example, screws, welds, staples, pins, or clamps can be used to rigidly couple the second end 408 of the foldable substrate (405) to the tensioner, while other fasteners, welds, pins, staples, or clamps rigidly couple the tensioner to the display mover. In one or more embodiments, the tensioner comprises a plurality of springs that apply loading forces biasing the second end 408 of the foldable substrate (405)

supporting the flexible display 104 toward the display mover, which is to the left and away from the rotor 501 in the view of FIG. 6.

This rigid coupling between the second end 408 of the foldable substrate (405) supporting the flexible display 104 and the tensioner, combined with the rigid coupling between the tensioner and display mover, ensures that no movement of the second end 408 of the foldable substrate (405) supporting the flexible display relative to the tensioner piece to which it is coupled occurs. Accordingly, when the tensioner applies a loading force to the second end 408 of the foldable substrate (405), all of that loading force works to straighten the foldable substrate (405) and, correspondingly, the flexible display 104.

This is in contrast to situations that occur when the second end 408 of the foldable substrate (405) is adhesively attached to the tensioner. In those situations, the adhesive can stretch, strain, elongate, or otherwise change the mechanical relationship between the second end 408 of the foldable substrate (405) and the component to which it is coupled. When this occurs, i.e., when coupling is non-rigid due to the fact that viscoelastic adhesives that exhibit creep and expansion over time and under loads are used, pillowing can still occur due to the fact that the load forces applied by the tensioner are not efficiently translated to the foldable substrate (405).

Embodiments of the disclosure contemplate that the pillowing effect can cause the flexible display 104 to "feel" like its moving when a user is delivering user input to the flexible display 104, especially along the portion 602 of the first device housing 101 that is experiencing the phenomena. Said differently, when delivering user input to the portion 602 of the flexible display 104 experiencing the pillowing effect 603, without the mechanical assembly (117) and rigid coupling provided by embodiments of the disclosure and/or the mechanical assembly (117), tensioner, and rigid coupling provided by embodiments of the disclosure, a user may feel the flexible display 104 moving up and down slightly relative to the device housing 601. The inclusion of the mechanical assembly (117) and rigid coupling, with or without the tensioner, prevents both the pillowing effect 603 in the first portion of the flexible display 104 and bunching, hanging, snagging, or other issues in the second portion 604 of the flexible display 104.

Advantageously, embodiments of the disclosure use a rigid coupling, such as by welding, pins, clamps, or screws, to ensure that the load forces applied by the tensioner are efficiently used to flatten the foldable substrate (405), thereby reducing or eliminating the pillowing effect. Advantageously, in addition to allowing for increased manufacturing tolerances of the various components, the inclusion of the tensioner, combined with the one or more fasteners rigidly coupling the second end 408 of the foldable substrate (405) supporting the flexible display 104 to the tensioner, works to keep the upper portion of the flexible display 104 flat, thereby eliminating the pillowing effect.

Figure 7:
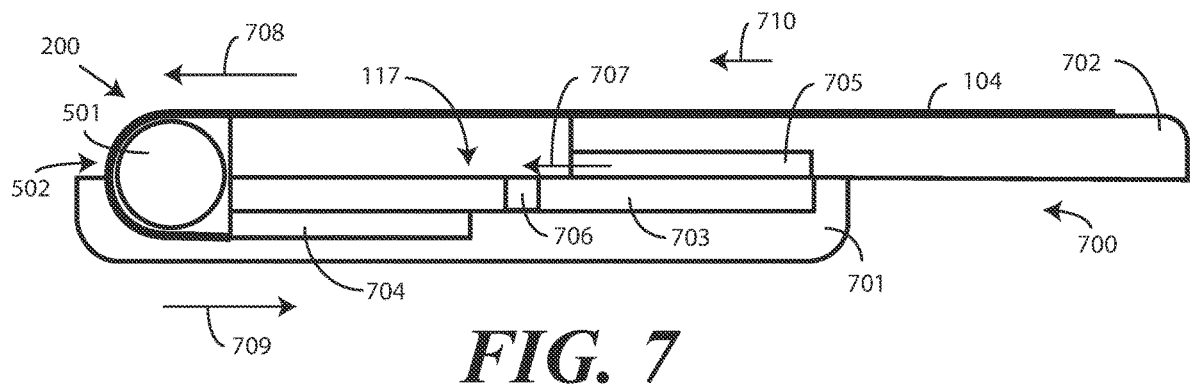
FIG. 7 illustrates a side sectional view of another explanatory flexible display and rotor assembly situated within a device housing of a sliding electronic device when the sliding electronic device is open.
Figure 8:
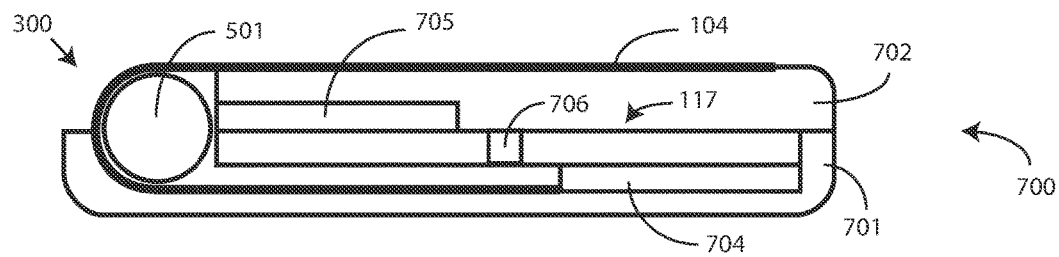
FIG. 8 illustrates a side sectional view the explanatory flexible display and rotor assembly of FIG. 7 situated within a device housing of a sliding electronic device when the sliding electronic device is closed.

Turning now to FIGS. 7-8, illustrated therein is one explanatory sliding electronic device 700 configured in accordance with one or more embodiments of the disclosure. The sliding electronic device 700 is shown in a cut-away view in FIGS. 7-8 so that the internal components, including the mechanical assembly 117, can be more readily seen. The sliding electronic device 700 is shown in the open position 200 in FIG. 7 and in the closed position 300 in FIG. 8.

As before, in one or more embodiments the electronic device 700 includes a first device housing 701 that is configured to slide relative to a second device housing between a closed position (300) and an open position 200. A flexible display 104 is included and has a foldable substrate (405) that is rigidly coupled to the second device housing 702 in this illustrative embodiment. In one or more embodiments, the foldable substrate (405) is rigidly coupled by one or more fasteners that couple an end of the foldable substrate (405) to the second device housing 702.

In one or more embodiments, the mechanical assembly 117 includes a slider framework 703, a display mover 704, and a housing mover 705. In this illustrative embodiment, the slider framework 703 is fixedly coupled to the first device housing 701. The display mover 704 slidably couples the flexible display 104 to the slider framework 703 when an end of the foldable substrate (405) is rigidly coupled to the display mover 704, while the housing mover 705 slidably couples the second device housing 702 to the slider framework 703 when the second device housing 702 is rigidly coupled to the housing mover 705. An actuator 706 is operatively coupled between the display mover 704 and the housing mover 705.

In one or more embodiments, the actuator 706 causes the display mover 704 and the housing mover 705 to slide 707 symmetrically in opposite directions 708,709 along the slider framework 703 when the second device housing 702 slides relative to the first device housing 701 between the closed position 300 of FIG. 8 and the open position 200 of FIG. 7.

A rotor 501 is positioned within a curvilinear section 502 of the flexible display 104. The rotor 501 causes a linear translation 710 of the flexible display 104 by moving the flexible display 104 around the rotor 501 when the rotor 501 rotates.

By comparing FIGS. 7 and 8, the movement of the display mover 704 and the housing mover 705 when the first device housing 701 and second device housing 702 transition between the open position 200 and the closed position 300 can be seen. In FIG. 7, the housing mover 705 is to the right of the display mover 704, which has moved to the end of the slider framework 703 so as to be adjacent to the rotor 501.

By contrast, in FIG. 8, the actuator 706 has caused the display mover 704 and the housing mover 705 to slide 707 symmetrically in opposite directions 708,709 along the slider framework 703 when the second device housing 702 slides relative to the first device housing 701 between the closed position 300 of FIG. 8 and the open position 200 of FIG. 7. In this illustrative embodiment, "sliding symmetrically in opposite directions" means that the housing mover 705 and the display mover 704 move at the same rate, and travel the same distance, in the opposite direction 708,709 in response to the action of the actuator 706.

This sliding of the display mover 704 and the housing mover 705 symmetrically in opposite directions performs a number of functions: First, the rigid coupling of the first end (407) and second end (408) of the foldable substrate (405) supporting the flexible display 104 ensures that the portions of the flexible display 104 situated beneath the rotor 501 do not bunch, crumple, hang, snag, or otherwise become maligned due to the fact that the display mover 704 is drawing one end of the flexible display 104 into the first device housing 701. Second, the rigid coupling of the first end (407) and second end (408) of the foldable substrate (405) supporting the flexible display 104 ensures that no pillowing occurs due to the fact that the rigid coupling of one end of the foldable substrate (405) supporting the flexible display 104 to the display mover 704, and the rigid coupling of the other end of the foldable substrate (405) supporting the flexible display 104 to the second device housing 702, ensures that all slack is removed from the flexible display 104. Third, this symmetrical sliding results in the second device housing 702 moving to the left (in these views) at the same rate, and across the same distance, as the end of the flexible display 104 coupled to the display mover 704 does in the first device housing 701.

In so doing, the mechanical assembly 117 functions as a reverse motion link with sliding-arms defined by the display mover 704 and the housing mover 705 that travel symmetrically in opposite directions 708,709 along the slider framework 703. Said differently, the mechanical assembly 117 defines a reverse motion link comprising the display mover 704 coupled to a second end of the flexible display 104, a housing mover 705 coupled to the second device housing 702, and an actuator 706 causing the second end of the flexible display 104 and the second device housing 702 to travel symmetrically in opposite directions 708,709 relative to the first device housing 701.

Figure 9:
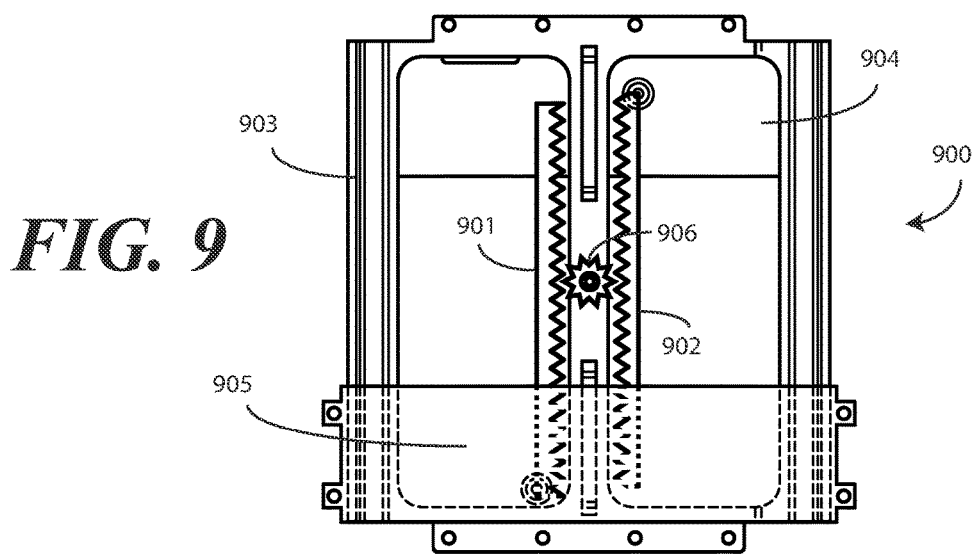
FIG. 9 illustrates one explanatory mechanical mechanism suitable for use in a sliding electronic device in accordance with one or more embodiments of the disclosure.

Turning now to FIG. 9, illustrated therein is one explanatory mechanical assembly defining such a reverse motion link 900 in accordance with one or more embodiments of the disclosure. As shown in FIG. 9, the reverse motion link 900 includes a slider framework 903, a display mover 904, a housing mover 905, and an actuator 906.

In this illustrative embodiment the actuator 906 comprises a first rack 901 coupled to the display mover 904 and a second rack 902 coupled to the housing mover 905. A pinion, which is pivotally coupled to the slider framework 903, engages the first rack 901 and the second rack 902. Rotation of the pinion causes the display mover 904 and the housing mover 905 to travel symmetrically in opposite directions.

It should be noted that the rack and pinion is just one example of an actuator 906 suitable for use with embodiments of the disclosure. Others will be obvious to those of ordinary skill in the art having the benefit of this disclosure. For instance, the rack and pinion of FIG. 9 can be replaced with drive screws that cause the display mover 904 and housing mover 905 to travel symmetrically in opposite directions to ensure that extension of a flexible display in a sliding electronic device occurs at the same rate and along the same distance as does displacement between a first device housing and a second device housing when the first device housing and second device housing translate between an open position and a closed position.

In still other embodiments, the actuator 906 can comprise a spring actuator. In particular, the actuator 906 can include a first pivoting header coupled to the display mover 904, a second pivoting header coupled to the housing mover 905, and a pivoting arm coupled to the slider framework 903. One or more springs positioned between the first pivoting header and the pivoting arm, and the second pivoting header and the pivoting arm, can bias the pivoting arm away from the first pivoting header, while also biasing the pivoting arm away from the second pivoting header. In so doing, the one or more springs of the actuator 906 can apply a loading force between the first pivoting header and the pivoting arm and the second pivoting header and the pivoting arm, respectively, to bias the display mover 904 away from the housing mover 905 when the electronic device to which the reverse motion link 900 is coupled is in either the open position (200) or the closed position (300). These examples are illustrative only, as other types of actuators will be obvious to those of ordinary skill in the art having the benefit of this disclosure.

Figure 10:
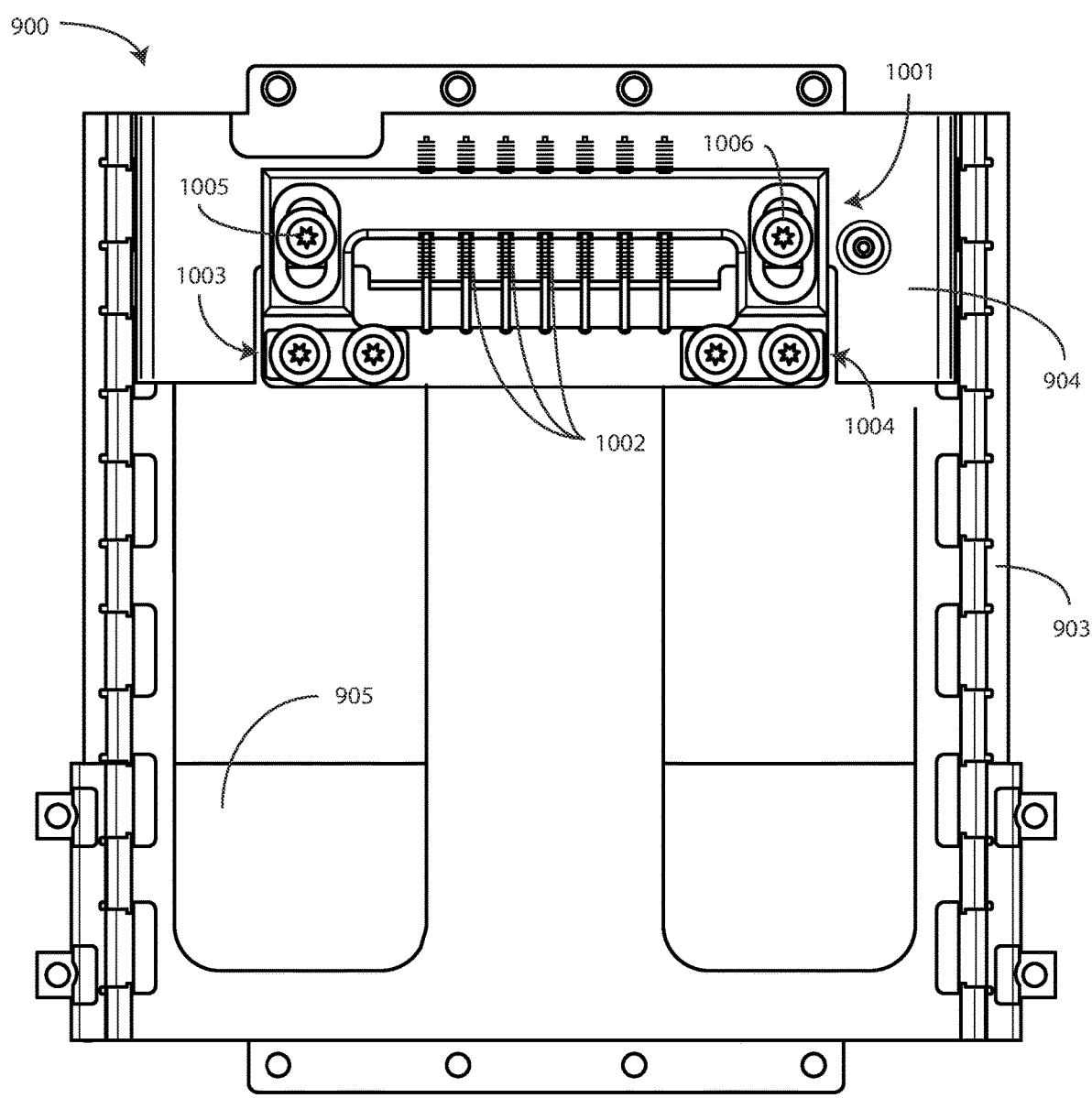
FIG. 10 illustrates another explanatory mechanical mechanism suitable for use in a sliding electronic device in accordance with one or more embodiments of the disclosure.

Turning now to FIG. 10, illustrated therein is a tensioner 1001 that can be attached to the display mover 904 of a reverse motion link 900 configured in accordance with embodiments of the disclosure, regardless of what type of actuator (906) is used. While the actuator (906) of FIG. 9 was positioned on the housing mover side of the slider framework 903, in the illustrative embodiment of FIG. 10 the actuator (906) is positioned on the display mover side of the slider framework 903 and is therefore not visible. It should be noted that the actuator (906) can be placed on either the housing mover side of the slider framework 903 or the display mover side of the slider framework 903, with the choice being made based upon design considerations and space limitations within an electronic device. In FIG. 10, the actuator (906) is positioned on the display mover side of the slider framework 903 due to the fact that the reverse motion link 900 also includes a tensioner 1001.

As before, the reverse motion link 900 includes a slider framework 903, a display mover 904, a housing mover 905, and an actuator (906). The display mover 904 is slidably coupled to the slider framework 903, as is the housing mover 905. The actuator (906) is coupled between the display mover 904 and the housing mover 905 and is operable to cause the display mover 904 and the housing mover 905 to slide symmetrically in opposite directions along the slider framework 903 when a second device housing coupled to the housing mover 905 slides relative to another second device housing to which the slider framework 903 is coupled between an open position and a closed position.

In this illustrative embodiment, the tensioner 1001 is coupled to the display mover 904 and is configured to couple an end of the foldable substrate supporting a flexible display to the display mover 904. Said differently, when a flexible display is attached to the reverse motion link 900 of FIG. 9, the tensioner 1001 is both rigidly coupled to the display mover 904 and rigidly coupled to the foldable substrate supporting the flexible display. In one or more embodiments, one or more fasteners rigidly couple the end of the foldable substrate supporting the flexible display to the tensioner 1001. Examples of such fasteners include welds, screws, pins, rivets, and clamps. Other examples of such fasteners will be obvious to those of ordinary skill in the art having the benefit of this disclosure.

In this illustrative embodiment, the tensioner 1001 comprises one or more springs 1002 that apply a loading force biasing an end of the foldable substrate supporting the flexible display toward an end of the slider framework 903. When the slider framework 903 is coupled to an electronic device as shown above if FIGS. 7-8, this causes the one or more springs 1002 to bias an end of the foldable substrate supporting the flexible display toward an end of the device housing to which the slider framework 903 is coupled.

The inclusion of the tensioner 1001 offers several advantages. First, it allows for increased mechanical tolerances of the various parts and components. Recall from above that one of the goals of including the reverse motion link 900 is to prevent pillowing and bunching of the flexible display. To keep the flexible display perfectly flat, the distance from the second device housing to which first end of the foldable substrate supporting the flexible display is coupled, around the rotor, and to the display mover 904 must precisely match the length of the foldable substrate supporting the flexible display. By including a tensioner 1001, which has screws 1003,1004 to rigidly attach to the second end of the foldable substrate supporting the flexible display, the one or more springs 1002 can apply a loading force allowing mechanical tolerances to be laxer while still keeping the flexible display flat. Moreover, in the illustrative embodiment of FIG. 10 the tensioner 1001 includes adjustment lugs 1005,1006 that allow the position of the tensioner 1001 to be moved up or down along the display mover 904, thereby allowing for each electronic device to be customized even when the length of the flexible displays encountered during manufacturing differs slightly.

Second, and more importantly, the one or more springs 1002 of the tensioner 1001 apply a loading force that keeps the foldable substrate supporting the flexible display, and thus the flexible display itself, flat. When users are delivering touch input to the flexible display, this keeps the flexible display from bouncing up and down or moving due to the fact that pillowing is eliminated.

Third, and most importantly, the inclusion of the tensioner 1001 ensures that there is no bunching, gathering, snagging, or other deleterious actions that occur when the first device housing and second device housing of the electronic device to which the reverse motion link 900 is coupled slide from the open position to the closed position. Said differently, when the end of the flexible display to which the tensioner 1001 is coupled moves into the first device housing to which the slider framework 903 is coupled, the tensioner 1001 helps to ensure that this portion of the flexible display is flat and smoothly slides into the device housing. In effect, since the curvilinear section of the flexible display passes around the rotor, the tensioner 1001 biases an end of the foldable substrate supporting the flexible display away from the rotor, which helps to ensure that the lower portion of the J-shape stays flat as the first device housing and second device housing move from the open position to the closed position.

It should be noted that the tensioner 1001 of FIG. 10 is only one example of how a tensioner can be configured in accordance with one or more embodiments of the disclosure. In other embodiments, rather than including a plurality of centrally disposed, linear springs, other tensioners can include two exterior springs that bias a foldable substrate supporting a flexible display that is rigidly coupled to a coupling plate away from a tensioner base. This type of tensioner base could be coupled to a display mover, while the flexible display coupling plate is coupled to the foldable substrate supporting the flexible display with the two exterior springs applying a loading force to remove slack from the foldable substrate supporting the flexible display.

By contrast, another tensioner could include a coiled spring with extension members that couple to the flexible display coupling plate. The extension members of the coiled spring can extend outward as the flexible display coupling plate moves relative to the tensioner base. Since the coiled spring applies a biasing force drawing the extension members into the coiled spring, the coiled spring applies a loading force to remove slack from a foldable substrate supporting a flexible display and coupled thereto. Other types of tensioners will be obvious to those of ordinary skill in the art having the benefit of this disclosure.

Figure 11:
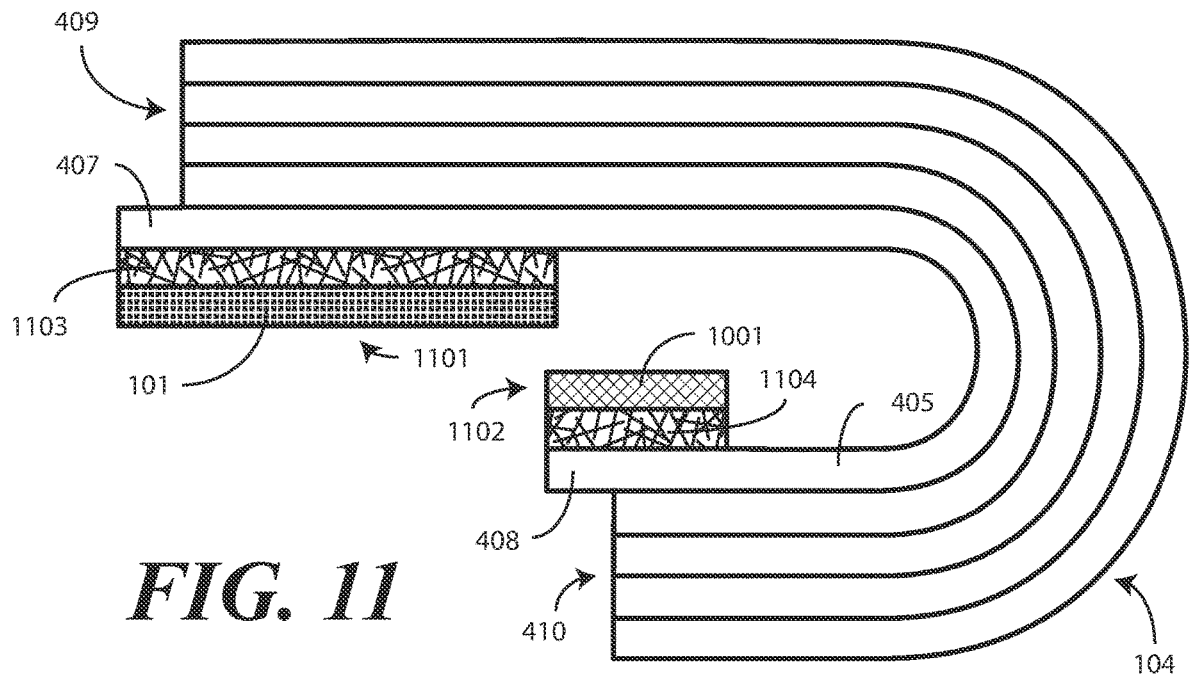
FIG. 11 illustrates a sectional view of one explanatory mechanical mechanism and flexible display assembly suitable for use in an electronic device configured in accordance with one or more embodiments of the disclosure.
Figure 12:
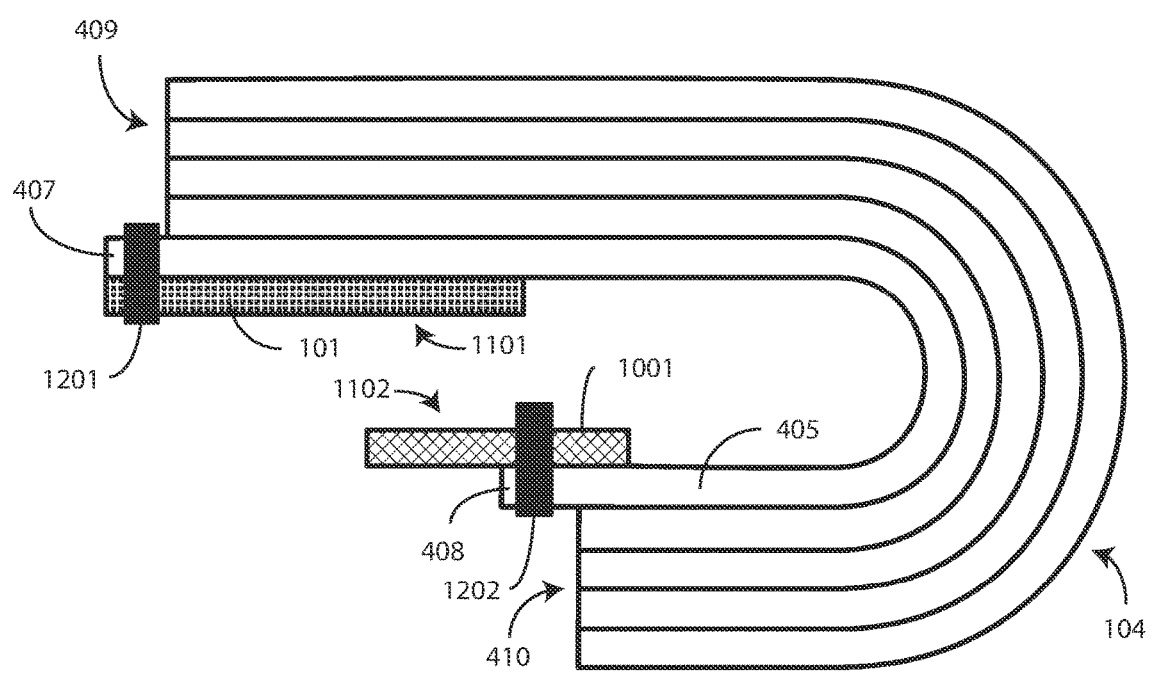
FIG. 12 illustrates another sectional view of one explanatory mechanical mechanism and flexible display assembly suitable for use in an electronic device configured in accordance with one or more embodiments of the disclosure.

Turning now to FIGS. 11-12, illustrated therein are sectional views illustrating how the flexible display 104 of FIG. 4 and the reverse motion link (900) of FIG. 10 can be coupled together. A comparison of FIGS. 11-12 illustrates the advantages of "rigidly" coupling a first end 407 of the foldable substrate 405 supporting the flexible display 104 to the first device housing 101 and a second end 408 of the foldable substrate 405 supporting the flexible display 104 the tensioner 1001 coupled to the display mover (904), as shown in FIG. 12, helps to eliminate pillowing in contrast to adhesively, i.e., non-rigidly, coupling the first end 407 of the foldable substrate 405 supporting the flexible display 104 to the first device housing 101 and a second end 408 of the foldable substrate 405 supporting the flexible display 104 the tensioner 1001 coupled to the display mover (904), as shown in FIG. 11.

It should be noted that in FIGS. 11 and 12, for simplicity only portions of the device housings 102,(103) of the electronic device (100) and the reverse motion link (900) are shown. Illustrating by example, only the portion 1101 of the first device housing 101 to which the housing mover (905) of the reverse motion link (900) is coupled is shown. Similarly, only a portion 1102 of the tensioner 1001 to which the second end 408 of the foldable substrate 405 supporting the flexible display 104 is shown. It is assumed that these portions 1101,1102, combined with the full diagrams shown in previous figures, will allow those of ordinary skill in the art having the benefit of this disclosure to readily understand the connections and couplings shown in FIGS. 11-12 without undue experimentation.

Beginning with FIG. 11, the flexible display 104 includes the flexible protective cover 401, which functions as a fascia by defining a cover for the flexible display layer 403. Beneath the flexible protective cover 401 is a first adhesive layer 402.

The flexible display layer 403 is then situated between the foldable substrate 405 and the flexible protective cover 401. As described above with reference to FIG. 4, the flexible display layer 403 may be formed from multiple layers of flexible material such as flexible sheets of polymer or other materials. Illustrating by example, the flexible display layer 403 can include a layer of optically pellucid electrical conductors, a polarizer layer, one or more optically transparent substrates, and layers of electronic control circuitry such as thin film transistors to actuate pixels and one or more capacitors for energy storage.

The flexible display layer 403 is coupled to the foldable substrate 405 by a second adhesive layer 404. The foldable substrate 405 is manufactured from metal in this illustrative embodiment, and thus defines the stiffest layer of the flexible display 104. In one or more embodiments the foldable substrate 405 is manufactured from stainless steel.

As shown in FIG. 11, the foldable substrate 405 is longer along a major axis (406) of the foldable substrate 405 than are any of the other layers of the flexible display 104. Accordingly, as shown in FIG. 11 the foldable substrate 405 includes a first end 407 and a second end 408 that extend distally beyond terminal ends 409,410 of the flexible display 104. This extra length along the major axis (406) allows one or more fasteners to rigidly couple the first end 407 and the second end 408 of the foldable substrate 405 to other components of the mechanical assembly as described below with reference to FIG. 12.

In FIG. 11, the first end 407 of the foldable substrate 405 is attached to the portion 1101 of the first device housing 101 attached to the housing mover (905) by a pressure sensitive adhesive 1103. Similarly, the second end 408 of the foldable substrate 405 is attached to the portion 1102 of the tensioner 1001 by a similar adhesive 1104. While this configuration can work adequately in practice, these adhesives 1103,1104 have viscoelastic properties that over time creep. Moreover, they can delaminate under constant loads. Creep and delamination are more pronounced when the area occupied by the adhesives 1103,1104 are smaller. While the foldable substrate 405 and the overall flexible display 104 are optimized to be flexible and to carry tensile loads, this creep and delamination can lead to, or cause, the pillowing effect described above.

To eliminate this issue, turning now to FIG. 12, the first end 407 and the second end 408 of the foldable substrate 405 that extend distally beyond the terminal ends 409,410 of the flexible display 104 can instead be "rigidly" coupled to the tensioner 1001 first device housing 101.

In one or more embodiments, one or more fasteners 1201,1202 are used to couple the first end 407 and the second end 408 of the foldable substrate 405 to the display mover (904) via the tensioner 1001 and first device housing 101. The use of such fasteners 1201,1202 "rigidly" couples these ends 407,408 of the foldable substrate 405 to their corresponding components because the fasteners 1201,1202 do not bend, slip, translate, or otherwise allow the ends of the foldable substrate 405 to move. This is in contrast to adhesively coupling the ends 407,408 of the foldable substrate 405 to the display mover (904) via the tensioner 1001 and first device housing 101 as described above with reference to FIG. 11. While the adhesive (1103,1104) can stretch, sheer, or expand to allow small amounts of movement of the first end 407 and/or the second end 408 of the foldable substrate 405 as a function of temperature, age, or other factors, the fasteners 1201,1202 of FIG. 12 do not expand, stretch, or sheer as a function of temperature or age. Examples of such fasteners 1201,1202 include welds, screws, pins, clamps, or other mechanical mechanisms that can fixedly attach the first end 407 and second end 408 of the foldable substrate 405 to the portion 1101 of the first device housing 101 and the portion 1102 of the tensioner 1001, as shown.

Advantageously, the system of FIG. 12 provides an improved sliding mechanism for a flexible display 104 in a sliding electronic device that eliminates crumpling and pillowing tendencies of the flexible display 104. Moreover, embodiments of the disclosure maintain this "pillowing prevention" by using fasteners 1201,1202 such as welds, pins, or clamps that rigidly couple the ends 407,408 of the foldable substrate 405 in place without allowing them to slide or translate once so fixed. Using such a mechanical assembly, combined with fasteners 1201,1202 that attach ends 407,408 of the foldable substrate 405 to other mechanical components of the assembly, the flexible display 104 maintains a flat upper portion of the J-shape shown in FIG. 12 while translating around the rotor (which is omitted from FIGS. 11-12 for ease of illustration).

It should be understood that this J-shape is defined when the first device housing 101 and second device housing 102 are positioned at certain geometric relationships relative to each other. Depending upon the length of the flexible display 104, combined with the amount the first device housing 101 can slide relative to the second device housing 102, the J-shape may transition to other shapes as well, including a U-shape where the upper and lower portions of the flexible display 104 are substantially symmetrical, or an inverted J-shape where the upper portion of the flexible display 104 is shorter than the lower portion of the flexible display 104, and so forth. Additionally, the flexible display 104 doesn't tend to crumple or bunch when sliding into the second device housing (102). Instead, the display mover (904) ensures a straight and true translation of the flexible display 104 into the second device housing (102) when the first device housing 101 and second device housing (102) slide from the open position to the closed position.

In one or more embodiments, a tensioner 1001 of FIG. 12 can be rigidly coupled between the display mover (904) and the second end 408 of the foldable substrate 405 supporting the flexible display 104. As described above with reference to FIG. 10, the tensioner 1001 can comprise one or more springs (1002) that apply a loading force biasing the second end 408 of the foldable substrate 405 supporting the flexible display 104 toward an end of the second device housing (102). Said differently, the tensioner 1001 can comprise one or more springs (1002) biasing an end 408 of the foldable substrate 405 supporting the flexible display 104 away from the rotor (which would be positioned in the round portion of the J-shape of FIG. 12). The tensioner 1001 helps to avoid the pillowing effect by applying a loading force to the second end 408 of the foldable substrate 405 that eliminates slack from the flat portions of the flexible display 104 defining the partial J-shape.

Figure 13:
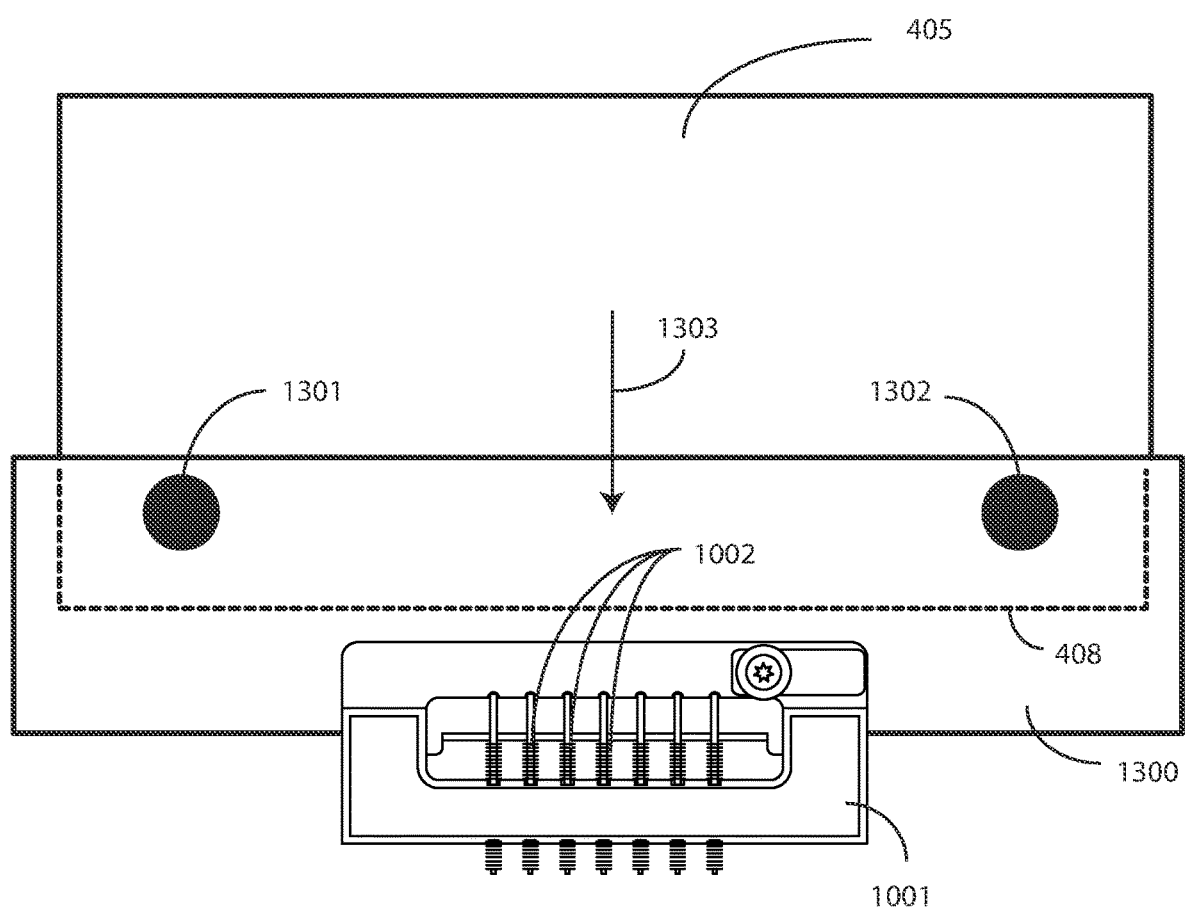
FIG. 13 illustrates one explanatory mechanical mechanism and flexible display assembly suitable for use in an electronic device configured in accordance with one or more embodiments of the disclosure.

Turning now to FIG. 13, illustrated therein is an alternate view of the assembly of FIG. 12. Here, the foldable substrate 405 is shown rigidly coupled to the tensioner 1001 by a pair of fasteners 1301,1302. In this illustrative embodiment, the fasteners 1301,1302 comprise welds. However, in other embodiments the fasteners 1301,1302 could comprise screws, staples, rivets, clamps, or pins. In this illustrative embodiment, a second end 408 of the foldable substrate 405 is rigidly coupled by the fasteners 1301,1302 to a foldable substrate plate 1300 that is attached to the tensioner 1001 (these combined elements are shown as a single block in FIG. 12 for ease of illustration). The use of a foldable substrate plate 1300 is optional but allows the tensioner 1001 to be a narrower component than the foldable substrate 405. In other embodiments, the foldable substrate plate 1300 will be omitted, with the foldable substrate 405 being coupled directly to the tensioner 1001 itself.

As described above with reference to FIG. 12, the first end (407) of the foldable substrate would then be rigidly coupled by one or more other fasteners to the first device housing (101). The tensioner 1001 comprises one or more springs 1002 that apply a loading force 1303 biasing the second end 408 of the foldable substrate 405 away from the one or more other fasteners rigidly coupling the first end (407) of the foldable substrate 405 to the first device housing (101). When attached to the reverse motion link (900) of FIG. 10, which is coupled to the second device housing (102), the tensioner 1001 would be coupled to the display mover (904) as previously described.

By configuring the assembly as shown in FIGS. 12-13, rigidly coupling the foldable substrate 405 to the first device housing (101) and tensioner 1001 or foldable substrate plate 1300 via welding, a fastener, a pin, or other form of clamping causes the significant load path from the first device housing (101) to the tensioner 1001 or foldable substrate plate 1300 to run through the foldable substrate 405 and the rigid coupling features, which are shown in FIG. 13 as fasteners 1301,1302. In one or more embodiments, despite the fact that rigid coupling via the fasteners 1301, 1302 is used, an adhesive interface can be also included between the foldable substrate 405 and the first device housing (101) and/or between the foldable substrate 405 and the tensioner 1001 or foldable substrate plate 1300 to reduce lift. Even in these instances, the significant load path from the first device housing (101) to the tensioner 1001 or foldable substrate plate 1300 will run predominantly through the foldable substrate 405 and the fasteners 1301,1302.

Figure 14:
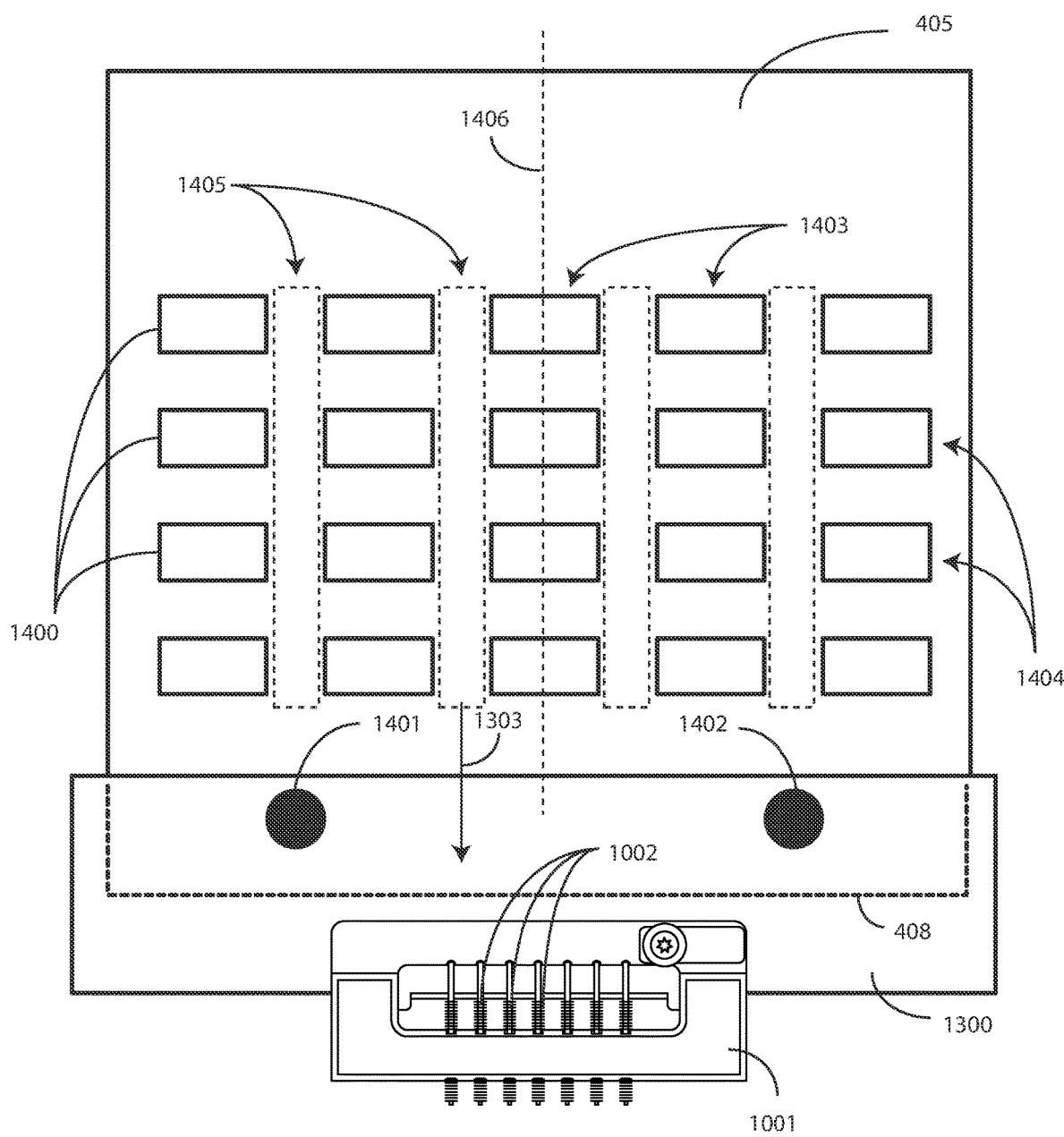
FIG. 14 illustrates one explanatory mechanical mechanism and flexible display assembly suitable for use in an electronic device configured in accordance with one or more embodiments of the disclosure.

In one or more embodiments, one or more load path directing apertures can be introduced into the foldable substrate supporting the flexible display. The one or more load path directing apertures work to direct loading forces applied by the tensioner in a direction that is substantially parallel with a major axis of the foldable substrate and, therefore, the flexible display. Illustrating by example, the one or more load path directing apertures can include columns of substantially rectangular apertures defining linear load paths therebetween that ensure that load forces are oriented parallel with the major axis of the stiffest layer, i.e., the foldable substrate, as those loading forces extend between the first end of the foldable substrate to the second end of the foldable substrate. Turning now to FIG. 14, illustrated therein is one such embodiment.

Generally, the assembly of FIG. 14 is configured as was the assembly of FIG. 13. To wit, a foldable substrate 405 is rigidly coupled to a tensioner 1001 by a pair of fasteners 1401,1402. In this illustrative embodiment, the fasteners 1401,1402 comprise pins. However, as noted above in other embodiments the fasteners 1401,1402 could comprise screws, staples, rivets, clamps, or welds.

A second end 408 of the foldable substrate 405 is rigidly coupled by the fasteners 1401,1402 to a foldable substrate plate 1300 that is attached to the tensioner 1001. The first end (407) of the foldable substrate would then be rigidly coupled by one or more other fasteners to the first device housing (101). The tensioner 1001 again comprises one or more springs 1002 that apply a loading force 1303 biasing the second end 408 of the foldable substrate 405 away from the one or more other fasteners rigidly coupling the first end (407) of the foldable substrate 405 to the first device housing (101).

As shown in FIG. 14, in this illustrative embodiment the foldable substrate 405 defines one or more load path directing apertures 1400. In the illustrative embodiment of FIG. 14, the one or more load path directing apertures 1400 are all substantially rectangular in cross section. In this illustrative embodiment, the columns 1403 of the one or more load path directing apertures 1400 are substantially parallel. While FIG. 14 illustrates five columns 1403 of four rows 1404 of apertures 1400, this is for ease of illustration. In practice, the number of load path directing apertures 1400 will generally be significantly much larger as the load path directing apertures 1400 can have a width on the order of one hundred micrometers.

In one or more embodiments, the one or more load path directing apertures 1400 define load force directing strips 1405 directing loading forces 1303 applied by the tensioner 1001 in a direction that is substantially parallel with a major axis 1406 of the foldable substrate 405, and thus the flexible display that the foldable substrate 405 supports. In the illustration, the five columns 1403 of four rows 1404 of substantially rectangular load path directing apertures 1400 defines six load force directing strips 1405 or "load paths." However, in practice the columns 1403 and rows 1404 of substantially rectangular load path directing apertures 1400 will define a much larger number of load paths due to their small size. The loading forces 1303 pass through the foldable substrate 405 along these load paths, rather than the flexible display it supports, due to the fact that the foldable substrate 405 is more rigid than the flexible display in one or more embodiments.

Figure 15:
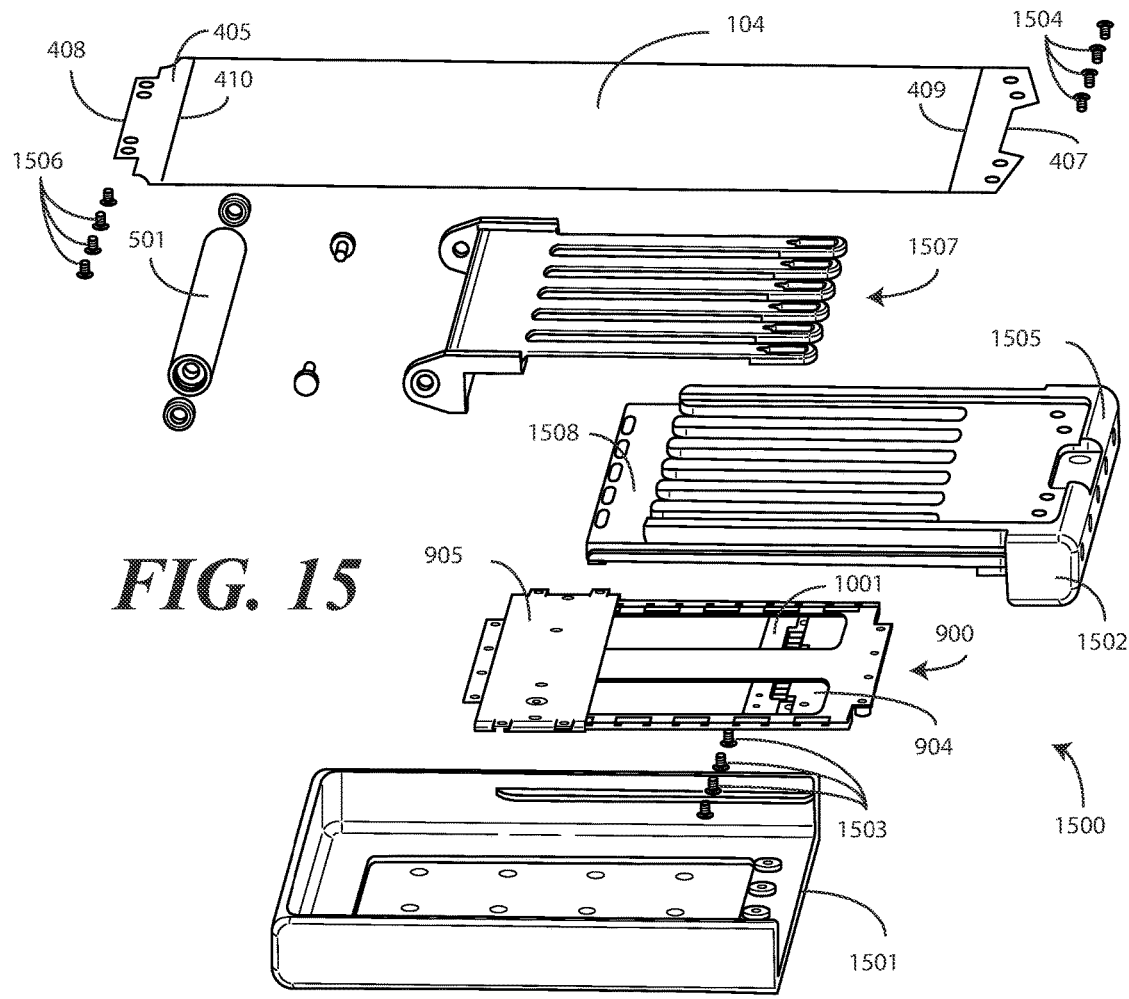
FIG. 15 illustrates an exploded view of one explanatory sliding electronic device in accordance with one or more embodiments of the disclosure.

Turning now to FIG. 15, illustrated therein is an exploded view of one explanatory electronic device 1500 configured in accordance with one or more embodiments of the disclosure. The electronic device 1500 includes a first device housing 1501 and a second device housing 1502. The electronic device also comprises a reverse motion link 900 including a display mover 904, a housing mover 905, and a tensioner 1001.

Other components of the electronic device 1500 include a flexible display (104) and a rotor 501. The flexible display (104) is supported by a foldable substrate 405, which is manufactured from metal in one or more embodiments and defines the stiffest layer of the flexible display assembly. The foldable substrate 405 comprises a first end 407 and a second end 408. In one or more embodiments. The first end 407 and the second end 408 of the foldable substrate 405 extend distally beyond corresponding terminal ends 409,410 of the flexible display (104).

The reverse motion link 900 gets fixedly coupled to the first device housing 1501. As described above, the reverse motion link 900 also includes an actuator, which is omitted from FIG. 15 for ease of illustration. One or more screws 1503 couple the housing mover 905 to the second device housing 1502.

The first end 407 of the foldable substrate 405 is rigidly coupled to a first end 1505 of the second device housing 1802 by one or more fasteners 1504, which in this illustrative embodiment comprise one or more screws. Similarly, the second end 408 of the foldable substrate 405 gets rigidly coupled to the tensioner 1001 by one or more other fasteners 1506, which are also shown as screws in this illustrative example. The tensioner 1001 is therefore coupled between the display mover 904 and the second end 408 of the foldable substrate 405.

The flexible display (104) and foldable substrate 405 then wrap around the rotor 501. The rotor 501 is attached to a mechanical support layer 1507 positioned between a first portion of the foldable substrate 405 and a translation surface 1508 defined by the second device housing 1502. The mechanical support layer 1507 is affixed to the first device housing 1501 in one or more embodiments. The mechanical support layer 1507 defines a plurality of fingers and is slidably coupled to the second device housing 1502 so that it can provide a support surface between the first portion of the foldable substrate 405 when the first device housing 1501 and second device housing 1502 slide relative to each other.

When assembled, the rotor 501 is positioned within a curvilinear section of the flexible display 104 between the first end 1505 of the second device housing 1502 and the tensioner 1001. The rotor 501 and the support layer 1507 translate linearly away from the second device housing 1502 when the electronic device 1500 slides to the open position.

In one or more embodiments, the support layer 1507 comprises a rigid part with a plurality of fingers that provide a substantially planar support for both the foldable substrate 405 and the flexible display (104) it supports. Illustrating by example, the support layer 1507 can be manufactured from a rigid thermoplastic or stainless steel in one or more embodiments. Other rigid materials suitable for manufacturing the support layer 1507 will be obvious to those of ordinary skill in the art having the benefit of this disclosure.

When the foldable substrate 405 is coupled to the second device housing 1502 and the tensioner 1001, a curvilinear section of the foldable substrate 405 engages the rotor 501. When the first device housing 1501 and second device housing 1502 slide relative to each other, the foldable substrate 405 wraps around the rotor 501 such that the first end 407 of the foldable substrate 405 extends further from the rotor 501 when the electronic device 1500 is in the open position. Similarly, the second end 408 of the foldable substrate 405 extends further from the rotor 501 when the electronic device 1500 is in the closed position.

In one or more embodiments, a cross section of the flexible display (104) defines a J-shape with a curved portion of the J-shape wrapped around the rotor 501 and an upper portion of the J-shape passing across a translation surface of the electronic device 1500 defined by the support layer 1507 and the second device housing 1502, which has corresponding grooves into which the fingers of the support layer 1507 slide when the electronic device 1500 is in the closed position. When the electronic device 1500 opens, the upper portion of the J-shape becomes longer as the flexible display (104) wraps around the rotor 501 and extends further out of the first device housing 1501. When the electronic device 1500 closes, the upper portion of the J-shape becomes shorter as the reverse operation occurs. Thus, when the first device housing 1501 translates relative to the second device housing 1502, the flexible display (104), and the foldable substrate 405, deform at different locations as it wraps and passes around the rotor 501.

Figure 16:
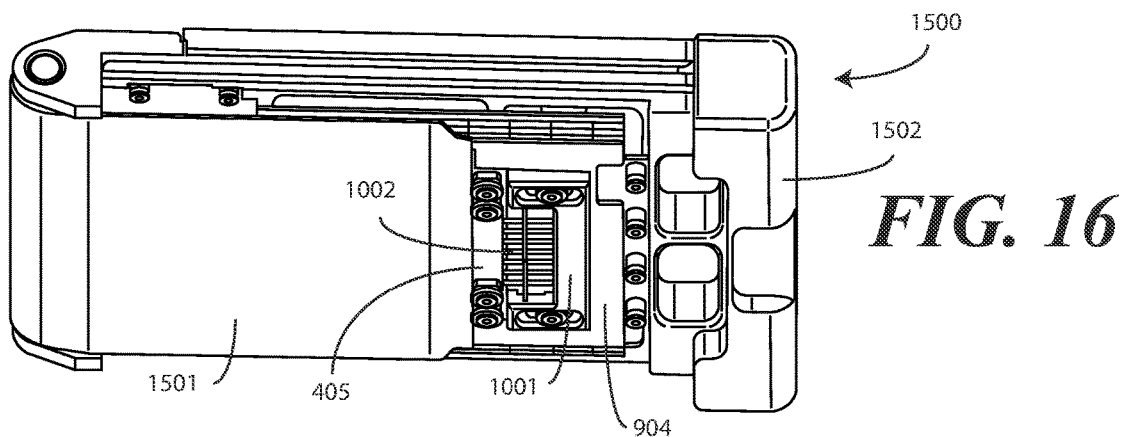
FIG. 16 illustrates a cut-away view of one explanatory sliding electronic device in accordance with one or more embodiments of the disclosure.

The assembled electronic device 1500 is shown in FIG. 16. The electronic device 1500 includes the first device housing 1501, which is now slidably coupled to the second device housing 1502. The foldable substrate 405 has a first end (407) coupled to the second device housing 1502 and a second end (408) coupled to the display mover 904 by the tensioner 1001. The housing mover (905) is coupled to the second device housing 1502. The actuator of the reverse motion link (900) causes the second end (408) of the foldable substrate 405 and the second device housing 1502 to travel symmetrically in opposite directions relative to the first device housing 1501.

As previously described, the tensioner 1001 comprises a plurality of springs 1002 coupled between the second end (408) of the foldable substrate 405 and the display mover 904. This plurality of springs 1002 apply a loading force biasing the second end (408) of the foldable substrate 405 toward the display mover 904. Said differently, the tensioner 1001 applies a loading force to remove slack from the foldable substrate 405, and thus the flexible display (104), as each passes around the rotor 501.

Figure 17:
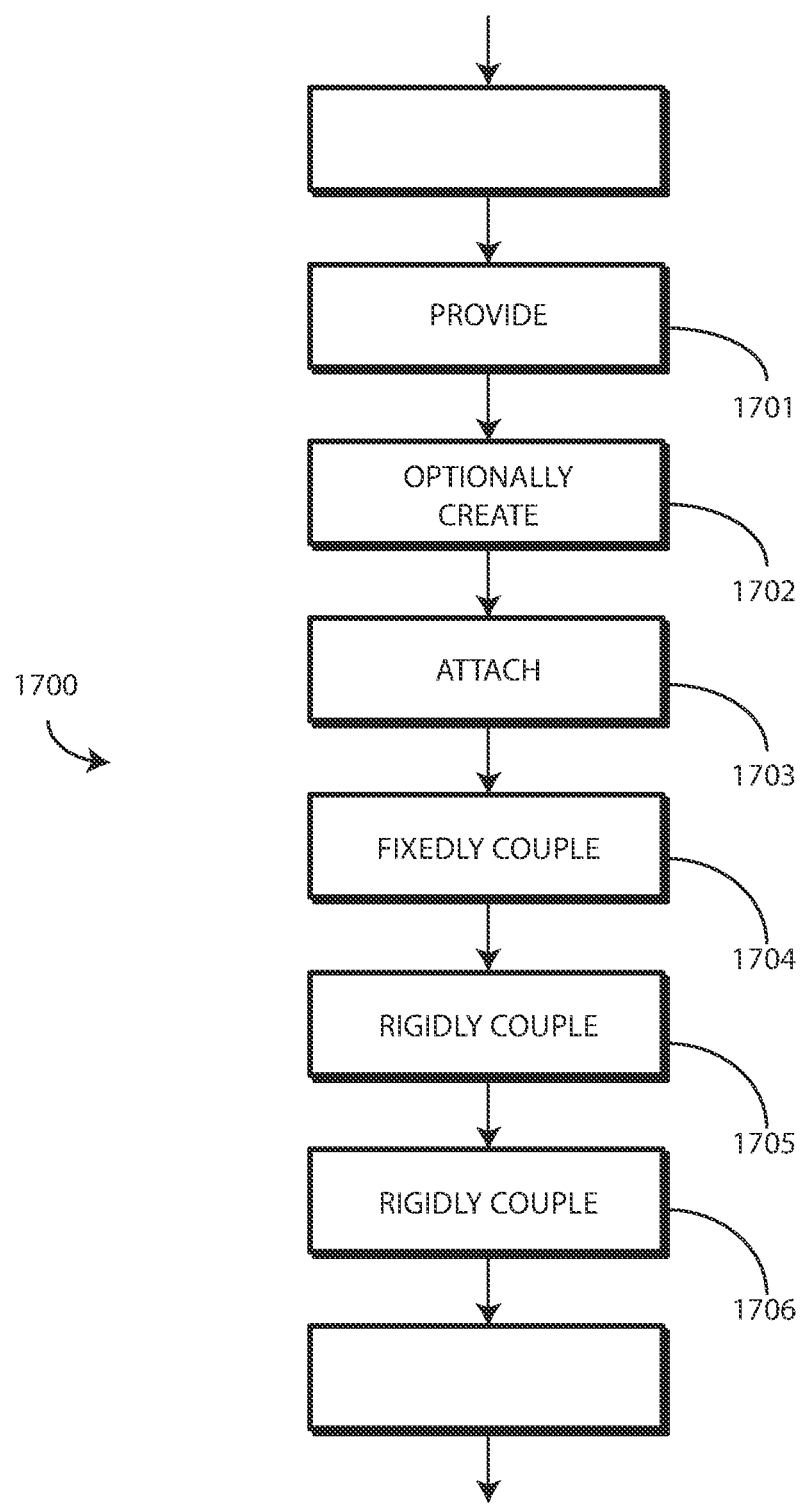
FIG. 17 illustrates one explanatory method in accordance with one or more embodiments of the disclosure.

Turning now to FIG. 17, illustrated therein is one explanatory method 1700 for constructing an electronic device in accordance with one or more embodiments of the disclosure. At step 1701, a first device housing and a second device housing are provided at step 1701, the first device housing can be coupled to the second device housing such that the first device housing is slidable relative to the second device housing.

At step 1703, a flexible display is attached to a foldable substrate. In one or more embodiments, a first end and a second end of the foldable substrate extend distally beyond corresponding terminal ends of the flexible display. In one or more embodiments, the foldable substrate is stiffer than are the other layers of the flexible display. At optional step 1702, one or more load path directing apertures may be created in the foldable substrate to direct loading forces applied to the foldable substrate in a direction that is substantially parallel with a major axis of the flexible display and foldable substrate.

At step 1704, a slider framework is fixedly coupled to the first device housing. In one or more embodiments, the slider framework has a housing mover slidably coupled thereto. In one or more embodiments, the slider framework has a display mover slidably coupled thereto as well. An actuator can be coupled between the display mover and the housing mover. In one or more embodiments, the actuator causes the display mover and the housing mover to slide symmetrically in opposite directions along the slider framework when the second device housing slides relative to the first device housing between a closed position and an open position.

At step 1705, a first end of the foldable substrate is coupled to the display mover. In one or more embodiments, the first end of the foldable substrate is rigidly coupled to the display mover. Illustrating by example, the first end of the foldable substrate can be rigidly coupled to the display mover by one or more fasteners, which can be screws, welds, pins, or clamps. In one or more embodiments the coupling is an indirect coupling at step 1705 due to the fact that a tensioner is mechanically coupled to the display mover between the display mover and the first end of the foldable substrate, with the first end of the foldable substrate being mechanically attached to the tensioner. In one or more embodiments, one or more springs of the tensioner apply a loading force biasing the first end of the foldable substrate toward the display mover.

At step 1706, one or more other fasteners mechanically attach a second end of the foldable substrate to the second device housing. In one or more embodiments, step 1706 comprises this attachment resulting in a curvilinear section of the flexible display being positioned about a rotor. In one or more embodiments, the tensioner biases the first end of the foldable substrate away from the rotor.

Figure 18:
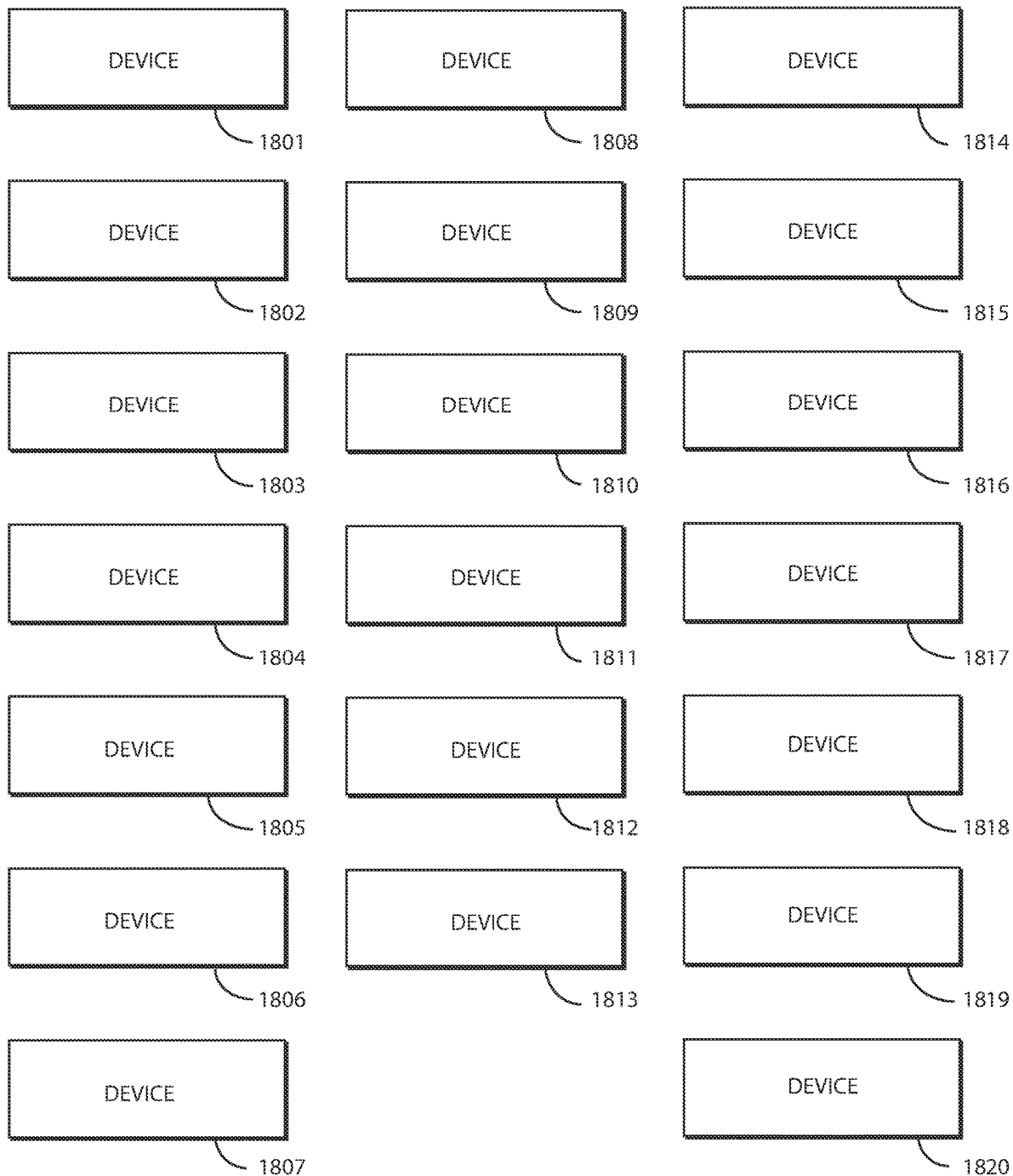
FIG. 18 illustrates various embodiments of the disclosure.

Turning now to FIG. 18, illustrated therein are various embodiments of the disclosure. The embodiments of FIG. 18 are shown as labeled boxes in FIG. 18 due to the fact that the individual components of these embodiments have been illustrated in detail in FIGS. 1-17, which precede FIG. 18. Accordingly, since these items have previously been illustrated and described, their repeated illustration is no longer essential for a proper understanding of these embodiments. Thus, the embodiments are shown as labeled boxes.

Beginning at 1801, an electronic device comprises a first device housing and a second device housing that is slidable relative to the first device housing. At 1801, the electronic device comprises a flexible display comprising a foldable substrate. At 1801, one or more fasteners couple a first end of the foldable substrate to the first device housing.

At 1802, the electronic device of 1801 further comprises one or more other fasteners mechanically attaching a second end of the foldable substrate to a tensioner. At 1803, the tensioner of 1802 comprises one or more springs applying a loading force biasing the second end of the foldable substrate away from the one or more fasteners. At 1804, the first end and the second end of the foldable substrate of 1803 extend distally beyond ends of the flexible display.

At 1805, the electronic device of 1804 further comprises a slider framework coupled to the second device housing. At 1805, the slider framework comprises a display mover slidably coupled to the display mover and mechanically attached to the tensioner.

At 1806, an electronic device comprises a first device housing and a second device housing that is slidable relative to the first device housing. At 1806, the electronic device comprises a flexible display supported by a foldable substrate.

At 1806, the electronic device comprises a slider framework fixedly coupled to the first device housing. At 1806, a display mover is slidably coupled to the slider framework. At 1806, one or more fasteners couple a first end of the foldable substrate to the display mover. At 1807, the electronic device of 1806 further comprises one or more other fasteners mechanically attaching a second end of the foldable substrate to the second device housing.

At 1808, the electronic device of 1807 further comprises a housing mover slidably coupling the second device housing to the slider framework. At 1808 the electronic device comprises an actuator coupled between the display mover and the housing mover. At 1808, the actuator causes the display mover and the housing mover to slide symmetrically in opposite directions along the slider framework when the second device housing slides relative to the first device housing between a closed position and an open position.

At 1809, the first end and the second end of the foldable substrate of 1807 extend distally beyond corresponding terminal ends of the flexible display. At 1810, the electronic device of 1809 comprises a tensioner mechanically coupled to the display mover between the display mover and the first end of the foldable substrate. At 1810, the one or more fasteners mechanically attach the first end of the foldable substrate to the tensioner.

At 1811, the tensioner of 1810 comprises one or more springs applying a loading force biasing the first end of the foldable substrate toward the display mover. At 1812, the electronic device of 1810 comprises a rotor positioned within a curvilinear section of the flexible display. At 1812, the tensioner biases the first end of the foldable substrate away from the rotor.

At 1813, the one or more fasteners of 1810 comprise welds. At 1814, the foldable substrate of 1813, is manufactured from stainless steel. At 1815, the one or more fasteners of 1810 comprise pins. At 1816, the one or more fasteners of 1810 comprise screws.

At 1817, the foldable substrate of 1810 defines one or more load path directing apertures directing loading forces applied by the tensioner in a direction that is substantially parallel with a major axis of the flexible display. At 1818, the one or more load path directing apertures of 1817 comprise columns of substantially rectangular apertures defining more load paths than there are columns.

At 1819, an electronic device comprises a first device housing slidably coupled to a second device housing. At 1819, the electronic device comprises a flexible display comprising a foldable substrate having a first end mechanically coupled to the second device housing by one or more fasteners.

At 1819, the electronic device comprises a reverse motion link comprising a display mover with a tensioner mechanically attached thereto. At 1819, a second end of the foldable substrate is mechanically attached to the tensioner by one or more other fasteners.

At 1820, the foldable substrate of 1819 defines one or more parallel columns of load path directing apertures. At 1820, the one or more parallel columns of load path directing apertures direct loading forces applied to the foldable substrate by the tensioner via the one or more other fasteners in a direction substantially parallel with a major axis of the flexible display.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
a first device housing and a second device housing that is slidable relative to the first device housing;
a flexible display comprising a foldable substrate having a first end of the foldable substrate rigidly coupled to the first device housing; and
a slider framework coupled to the second device housing;
wherein:
a second end of the foldable substrate is rigidly coupled to a tensioner;
the tensioner comprises one or more springs applying a loading force biasing the second end of the foldable substrate away from the first end of the foldable substrate;
the first end and the second end of the foldable substrate extending distally beyond terminal ends of the flexible display; and
the slider framework comprises a display mover slidably coupled to the display mover and mechanically attached to the tensioner.

2. The electronic device of claim 1, wherein the second end of the foldable substrate is rigidly coupled to the tensioner by one or more fasteners.

3. The electronic device of claim 1, the tensioner comprising one or more adjustment lugs.

4. The electronic device of claim 3, the one or more adjustment lugs allowing a position of the tensioner to be moved along the display mover.

5. The electronic device of claim 1, wherein the foldable substrate is manufactured from metal.

6. An electronic device, comprising:
a first device housing and a second device housing that is slidable relative to the first device housing;
a flexible display supported by a foldable substrate;
a slider framework fixedly coupled to the first device housing;
a display mover slidably coupled to the slider framework; and
one or more fasteners coupling a first end of the foldable substrate to the display mover.

7. The electronic device of claim 6, further comprising one or more other fasteners mechanically attaching a second end of the foldable substrate to the second device housing.

8. The electronic device of claim 7, further comprising:
a housing mover slidably coupling the second device housing to the slider framework; and
an actuator coupled between the display mover and the housing mover, the actuator causing the display mover and the housing mover to slide symmetrically in opposite directions along the slider framework when the second device housing slides relative to the first device housing between a closed position and an open position.

9. The electronic device of claim 7, wherein the first end and the second end of the foldable substrate extend distally beyond corresponding terminal ends of the flexible display.

10. The electronic device of claim 9, further comprising a tensioner mechanically coupled to the display mover between the display mover and the first end of the foldable substrate, wherein the one or more fasteners mechanically attach the first end of the foldable substrate to the tensioner.

11. The electronic device of claim 10, the tensioner comprising one or more springs applying a loading force biasing the first end of the foldable substrate toward the display mover.

12. The electronic device of claim 10, further comprising a rotor positioned within a curvilinear section of the flexible display, wherein the tensioner biases the first end of the foldable substrate away from the rotor.

13. The electronic device of claim 10, wherein the one or more fasteners comprise welds.

14. The electronic device of claim 13, wherein the foldable substrate is manufactured from stainless steel.

15. The electronic device of claim 10, wherein the one or more fasteners comprises pins.

16. The electronic device of claim 10, wherein the one or more fasteners comprise screws.

17. The electronic device of claim 10, the foldable substrate defining one or more load path directing apertures directing loading forces applied by the tensioner in a direction that is substantially parallel with a major axis of the flexible display.

18. The electronic device of claim 17, wherein the foldable substrate is more rigid than the flexible display.

19. An electronic device, comprising:
a first device housing slidably coupled to a second device housing;
a flexible display comprising a foldable substrate having a first end mechanically coupled to the second device housing by one or more fasteners; and
a reverse motion link comprising a display mover with a tensioner mechanically attached thereto;
wherein a second end of the foldable substrate is mechanically attached to the tensioner by one or more other fasteners.

20. The electronic device of claim 19, the foldable substrate defining one or more parallel columns of load path directing apertures directing loading forces applied to the foldable substrate by the tensioner via the one or more other fasteners in a direction substantially parallel with a major axis of the flexible display.

* * * * *